United States Patent
Tanabe

(10) Patent No.: US 6,642,091 B1
(45) Date of Patent: Nov. 4, 2003

(54) THIN-FILM SEMICONDUCTOR DEVICE AND APPARATUS FOR FABRICATING THIN-FILM SEMICONDUCTOR DEVICE

(75) Inventor: Hiroshi Tanabe, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/615,058

(22) Filed: Jul. 12, 2000

(30) Foreign Application Priority Data

Jul. 15, 1999 (JP) .......................................... 11-201974

(51) Int. Cl.[7] .......................... H01L 21/00; H01L 21/84
(52) U.S. Cl. ..................... 438/166; 438/905; 438/680
(58) Field of Search .......................... 438/166, 308, 438/680, 475, 486, 149, 905, 908

(56) References Cited

U.S. PATENT DOCUMENTS

| | | | | |
|---|---|---|---|---|
| 5,248,630 A | * | 9/1993 | Serikawa et al. | 438/166 |
| 5,648,276 A | * | 7/1997 | Hara et al. | 438/164 |
| 5,753,542 A | * | 5/1998 | Yamazaki et al. | 438/162 |
| 6,017,779 A | * | 1/2000 | Miyasaka | 438/149 |
| 6,133,148 A | * | 10/2000 | Won et al. | 438/680 |
| 6,271,066 B1 | * | 8/2001 | Yamazaki et al. | 438/166 |
| 6,482,752 B1 | * | 11/2002 | Yamazaki et al. | 438/758 |

FOREIGN PATENT DOCUMENTS

| | | |
|---|---|---|
| JP | 3-292719 | 12/1991 |
| JP | 5-21393 | 1/1993 |
| JP | 5-182919 | 7/1993 |
| JP | 5-182923 | 7/1993 |
| JP | 5-326397 | 12/1993 |
| JP | 7-99321 | 4/1995 |
| JP | 7-118443 | 12/1995 |
| JP | 9-7911 | 1/1997 |
| JP | 9-8316 | 1/1997 |
| JP | 9-17729 | 1/1997 |
| JP | 9-36376 | 2/1997 |
| JP | 9-139356 | 5/1997 |
| JP | 9-320961 | 12/1997 |
| JP | 10-116989 | 5/1998 |
| JP | 10-149984 | 6/1998 |
| JP | 11-8195 | 1/1999 |
| JP | 11-17185 | 1/1999 |

* cited by examiner

Primary Examiner—David Nhu
(74) Attorney, Agent, or Firm—McGinn & Gibb, PLLC

(57) ABSTRACT

There is provided a method of fabricating a thin-film semiconductor device, including the steps of (a) melting and recrystallizing at least a surface of a thin semiconductor film formed on a substrate, in a pressure lower than an atmospheric pressure or in inert gas atmosphere, (b) keeping the substrate in atmosphere including oxygen gas, and (c) forming an insulating film on the thin semiconductor film with the substrate being kept in a pressure lower than an atmospheric pressure or inert gas atmosphere.

25 Claims, 14 Drawing Sheets

TIMING CHART A

TIMING CHART B

DIRECTIONS IN WHICH STAGE MOVES

DIRECTIONS IN WHICH STAGE TILTS

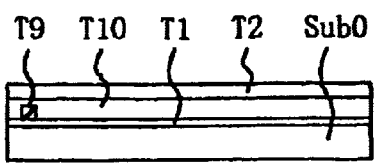
FIG. 13A
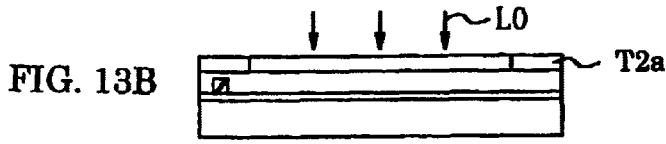
FIG. 13B
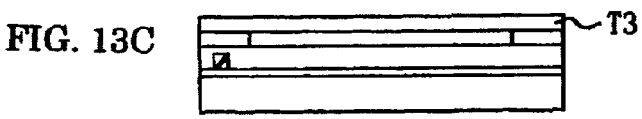
FIG. 13C
FIG. 13D
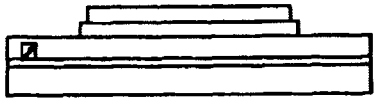
FIG. 13E
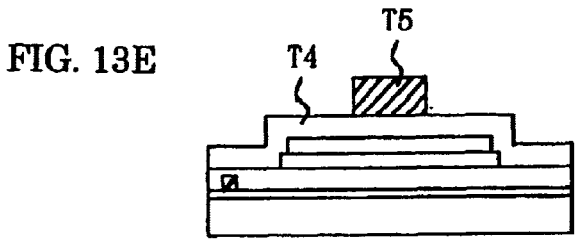
FIG. 13F
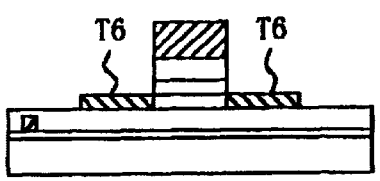
FIG. 13H
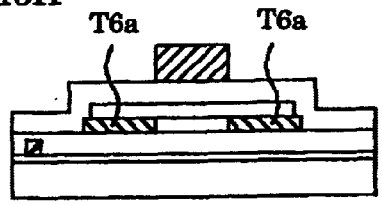
FIG. 13G
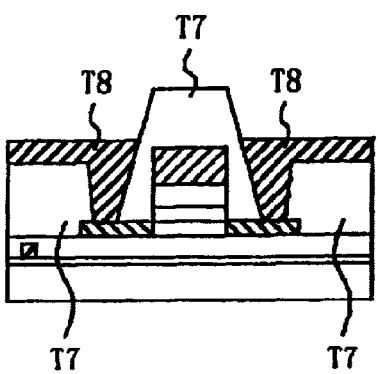
FIG. 13I
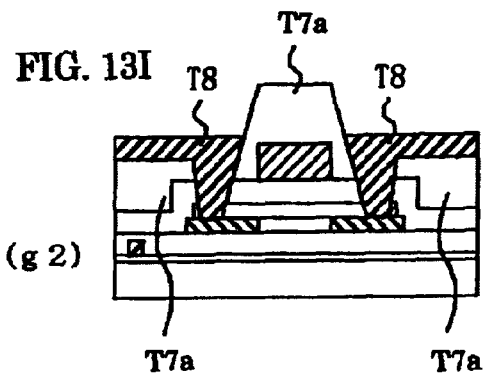
(g 2)

THIN-FILM SEMICONDUCTOR DEVICE AND APPARATUS FOR FABRICATING THIN-FILM SEMICONDUCTOR DEVICE

BACKGROUND OF THE INVENTION

1. Field of the Invention

The invention relates to a method of fabricating a thin-film semiconductor device and an apparatus for fabricating the same, and more particularly to a method of forming a thin silicon film used for a crystalline silicon thin-film transistor, and an interface between semiconductor and an insulating film, used for a field effect transistor, and further to an apparatus of fabricating such a thin silicon film and such an interface.

2. Description of the Related Art

Japanese Patent Publication No. 7-118443 has suggested a method including the step of radiating laser beam having a short wavelength, to an amorphous silicon thin film formed on an amorphous substrate, to thereby fabricate a thin film transistor. The method makes it possible to crystallize amorphous silicon without wholly heating the substrate, and hence, makes it possible to fabricate a semiconductor device or a semiconductor integrated circuit on a substrate having a wide area such as a substrate to be used for a liquid crystal display, or a cheap substrate such as glass.

Japanese Unexamined Patent Publication No. 9-320961 has suggested a method of fabricating a thin-film transistor. In this method, the steps of forming an amorphous silicon thin film to which laser beam is to be radiated, radiating laser beam to the amorphous silicon thin film, carrying out hydrogenation in plasma, and forming a gate insulating film are carried out in this sequence or other sequences without exposure to atmosphere.

The Publication also discloses an apparatus of fabricating a semiconductor thin film, including a first chamber in which a substrate is loaded in vacuum, a second chamber in which silicon is formed, a third chamber in which laser beam is radiated, a fourth chamber in which an insulating film is formed, a fifth chamber in which annealing is carried out in hydrogen atmosphere, a sixth chamber in which a substrate is unloaded, and a seventh chamber through which a substrate is transferred to other chambers.

A glass substrate is transferred into the apparatus from the first chamber. The glass substrate can be transferred to any one of the chambers through the seventh chamber and a vacuum valve. The first to seventh chambers are equipped with a gas exhaust system independently of one another, and hence, can exhaust reactive gas, inert gas and other gases introduced from gas introducers in the steps of forming a silicon film, forming an insulating film, and annealing.

When a substrate is transferred out of any one of the chambers, the chamber is sufficiently exhausted. When the chamber has almost the same pressure as that of the seventh chamber, a vacuum valve is released, and then, a substrate is taken out of the chamber by means of a robot. Then, the vacuum valve is closed.

The substrate is introduced into a next chamber having almost the same vacuum degree as that of the seventh chamber after releasing a vacuum valve, transferring the substrate into the third chamber, and closing the vacuum valve. After closing the vacuum valve, a process gas is introduced into the chamber, and a pressure and a temperature in the chamber are adjusted to a predetermined pressure and temperature. Then, laser beam is radiated to the substrate.

The substrate is transferred among the first to sixth chambers in such a manner as mentioned above. A plurality of substrates can be transferred among the chambers through the use of a plurality of robots, in which case, the chambers are sufficiently exhausted. A vacuum valve may be released and closed, and the substrate may be transferred after the chambers are caused to have almost the same pressure in inert gas, nitrogen gas or hydrogen gas atmosphere.

The substrate is transferred between the first chamber and atmosphere and further between the sixth chamber and atmosphere, after nitrogen or inert gas is leaked with the vacuum valve being closed, and a valve is released to thereby allow the first and sixth chambers to be in fluid communication with atmosphere.

Thus, all the steps are carried out without exposure to atmosphere. The reason is as follows. Since a surface of silicon formed by laser crystallization is quite active, contaminants are likely to be adhered to the surface, if the silicon is exposed to atmosphere. This results in degradation in performances of resultant TFT. As an alternative, there is dispersion among performances of TFT. In order to avoid such degradation or dispersion, all the steps are carried out without exposure to atmosphere.

The inventor conducted the experiment in which excimer laser crystallization and formation of a silicon dioxide film were carried out in the same apparatus in two cases in one of which a substrate was exposed to atmosphere and in the other of which a substrate was not exposed to atmosphere. Herein, "the same apparatus" includes a case in which a substrate is transferred to another apparatus without exposure to atmosphere. In the case in which a substrate was not exposed to atmosphere, a fabrication yield was much enhanced because dusts and particles were prevented from adhering to a product. However, it was also found out that such enhancement in a fabrication yield can be obtained by enhancing cleanness in a clean room. A fabrication yield was enhanced best in an film-forming apparatus including a washing device therein.

Comparing a trap level density in a silicon film to an interface level density (or density of electric charge in a fixed oxide film), the trap level density is obviously greater than the interface level density. That is, there is a problem of insufficiency in performances of a silicon film (or a trap level density) in order to have sufficient cleanness in a product having a silicon film and a gate insulating film both formed without exposure to atmosphere in the same apparatus.

The inventor analyzed the above-mentioned problem, and resultingly, found out the following problems in connection with steps of fabricating a silicon film and a gate insulating film and an apparatus of fabricating the same.

The first problem is as follows. For instance, in a cluster tool type apparatus suggested in Japanese Unexamined Patent Publication No. 7-99321, a plurality of chambers is arranged having its own purpose. Hence, it is quite difficult to keep a chamber located at a core, away from contaminants. There occurs cross-contamination in transfer of a substrate between chambers, even though the cross-contamination is slight.

The second problem is as follows. For instance, an in-line type apparatus suggested in Japanese Unexamined Patent Publication No. 5-182923 is accompanied with a problem that it is unavoidable generation of minute dust, in particular, metal particles due to a great frictional area between parts in vacuum.

The third problem is as follows. Silicon crystallized by laser beam would have a quite active surface. For instance, if silicon is coated with active species having energy, for instance, radical species such as hydrogen radical, oxygen radical, hydrogen ion, oxygen ion, ion species or ozone, after the silicon has been crystallized by laser beam, but before a gate insulating film is formed, contaminants adhered to a wall of a chamber and metal constituting a wall of a chamber are excited, resulting in that atmosphere in which a substrate is put is contaminated.

The fourth problem is that since laser radiation in oxidation atmosphere reflects dispersion in laser intensity in a step of introducing oxygen into silicon, there would be dispersion in a concentration of oxygen in a silicon film. This results in non-uniformity in characteristics of resultant silicon films.

The fifth problem is as follows. When a plurality of steps are to be successively carried out without exposure to atmosphere, for instance, steps of crystallizing a silicon film by means of laser beam and thereafter forming a gate insulating film, though it is possible to reduce contaminants adhered to the silicon film by not exposing the silicon film to atmosphere, the above-mentioned problems still interfere with fabrication of a semiconductor device. A conventional method of fabricating a semiconductor device such as LSI includes a step of carrying out thermal oxidation at about 1000 degrees centigrade to form an interface in a crystalline silicon film. This means that it is necessary to control contaminants even in a vacuum apparatus.

There has been suggested remote plasma chemical vapor deposition (CVD) to reduce damage caused by plasma and form a qualified gate insulating film. For instance, Japanese Unexamined Patent Publication No. 5-21393 has suggested a plasma CVD apparatus including a first chamber in which plasma is generated and a second chamber in which a substrate is processed. The first chamber is separate from the second chamber. It is considered that the suggested apparatus would accomplish a low density of electric charge of a fixed oxide film in the range of $1\times10^{11}$ to $1\times10^{12} cm^{-2}$, and a low interface level density smaller than $6\times10^{10} cm^{-2} eV^{-2}$. However, this advantage of accomplishing such low densities is restricted to performances of a silicon film.

The sixth problem is as follows. A chamber in which a substrate is processed is frequently caused to have a high vacuum degree or a low pressure in order to prevent contaminants from adhering to a surface of a substrate. In particular, in plasma CVD where a film is to be formed at a pressure smaller than atmospheric pressure, a chamber is exhausted almost to an ultimate vacuum degree except while a film is being formed. For the same reason, a chamber through which a substrate is transferred to another chambers, in a batch-type apparatus, is exhausted almost to and kept at an ultimate vacuum degree.

In an excimer laser radiation apparatus, excimer laser beam is often radiated in vacuum atmosphere. However, silicon particles separated from a silicon film during laser radiation are adhered to a window through which laser beam is introduced into the apparatus, resulting in reduction in a laser transmission rate with the lapse of time.

In order to solve this problem, Japanese Unexamined Patent Publication No. 9-139356 has suggested a laser annealing apparatus in which excimer laser beam is focused on a window to which silicon is adhered, to thereby thermally decompose silicon. However, in this apparatus, since a laser beam which is usually focused on a surface of a substrate is focused on a surface of the window having a different optical length, it would be absolutely necessary to rearrange optical systems. When there are employed optical systems having a small focal length, in particular, when mask projection method is carried out, it is necessary to accurately position optical systems, resulting in reduction in an operation efficiency of the apparatus.

Japanese Unexamined Patent Publication No. 3-292719 has suggested a method of forming a silicon semiconductor layer, including the steps of forming a silicon semiconductor layer on an insulating substrate at a temperature equal to or lower than 600 degrees centigrade, and radiating energy beam to the silicon semiconductor layer to thereby turn the silicon semiconductor layer into polysilicon.

Japanese Unexamined Patent Publication No. 9-36376 has suggested a method of fabricating a thin-film semiconductor device, including the steps of forming a thin semiconductor film on an insulating substrate, the thin semiconductor film containing hydrogen at 10% or greater as well as inert impurities, annealing the insulating substrate at 350 degrees centigrade or higher to thereby remove hydrogen such that the thin semiconductor film contains hydrogen at 10% or smaller, and radiating laser beam to the thin semiconductor film to thereby activate the impurities.

Japanese Unexamined Patent Publication No. 5-326397 has suggested a method of fabricating a semiconductor device, including the steps of forming an amorphous semiconductor film on a semiconductor substrate at such a temperature that the amorphous semiconductor film has a planar surface at a pressure smaller than an atmospheric pressure, annealing the semiconductor substrate in inert gas atmosphere at a temperature higher than a temperature at which the amorphous semiconductor film is formed, to thereby turn the amorphous semiconductor film into a polysilicon film having irregularities at a surface thereof, the polysilicon film acting as a first electrode of a capacitor, forming a dielectric film on the first electrode, and forming a second electrode on the dielectric film.

Japanese Unexamined Patent Publication No. 5-182919 has suggested a method of fabricating a thin polysilicon film, including the steps of forming an amorphous silicon film on a glass substrate by LPCVD, putting the substrate in an oxygen atmosphere to thereby oxidize a surface of the amorphous silicon film, and annealing the amorphous silicon film in inert gas atmosphere at 600 degrees centigrade or smaller to thereby turn the amorphous silicon film into polysilicon.

Japanese Unexamined Patent Publication No. 11-17185 has suggested a method of fabricating a liquid crystal display device, including the steps of forming a semiconductor film almost all over a substrate to define an insulating gate type transistor, heating and recrystallizing the semiconductor film, forming a gate insulating film of the insulating gate type transistor on the thus recrysallized semiconductor film, and forming a gate electrode of the insulating gate type transistor almost all over the gate insulating film. All of the steps are carried out in an apparatus which is kept vacuous.

Japanese Unexamined Patent Publication No. 10-149984 has suggested a method of forming polysilicon, including the steps of radiating laser beam to an amorphous silicon film formed on a substrate, in a hermetically sealed chamber, and annealing the amorphous silicon film to thereby turn the film into polysilicon. The chamber is designed to have a vacuum degree of 0.1 Torr or higher, and have atmosphere of at least one of hydrogen, nitrogen and inert gas.

Japanese Unexamined Patent Publication No. 10-116989 has suggested a method of fabricating a thin-film transistor, including the steps of forming a semiconductor film on a substrate without exposure to atmosphere, crystallizing the semiconductor film in non-oxidizing atmosphere without exposure of the substrate to atmosphere, forming a first gate insulating film on the semiconductor film without exposure of the substrate to atmosphere, annealing the first gate insulating film and the semiconductor film, patterning the first gate insulating film and the semiconductor film, hydrogenating the substrate, and forming a second gate insulating film on the first gate insulating film.

Japanese Unexamined Patent Publication No. 9-17729 has suggested a method of fabricating a semiconductor device, including the steps of forming a first insulating film, a thin amorphous semiconductor film, and a second insulating film on an upper surface of an insulating substrate without exposure to atmosphere, and radiating laser beam through a lower surface of the insulating substrate to thereby turn the thin amorphous semiconductor film into crystal.

Japanese Unexamined Patent Publication No. 9-7911 has suggested an apparatus for fabricating a semiconductor device, including (a) a laser annealing unit having a chamber in which a substrate is kept hermetically sealed, and in which laser beam is radiated to the substrate, (b) a film-forming unit having a chamber in which a substrate is kept hermetically sealed, and in which a thin film is formed on the substrate, and (c) a transfer unit which transfers the substrate between the chambers with the substrate being kept hermetically sealed.

SUMMARY OF THE INVENTION

In view of the above-mentioned problems, it is an object of the present invention to provide a method and an apparatus both of which is capable of fabricating a thin silicon film having a low trap level density, by radiating laser beam thereto.

It is also an object of the present invention to provide a method and an apparatus both of which are capable of providing an interface between semiconductor and an insulating film which interface has a small interface level density, that is, a field effect transistor having improved characteristics.

Another object of the present invention is to provide a method and an apparatus both of which are capable of forming the above-mentioned thin silicon film at a temperature in the range of room temperature to 600 degrees centigrade for the purpose of allowing to use a cheap glass substrate.

In one aspect of the present invention, there is provided a method of fabricating a thin-film semiconductor device, comprising the steps of (a) melting and recrystallizing at least a surface of a thin semiconductor film formed on a substrate, in a pressure lower than an atmospheric pressure or in inert gas atmosphere, (b) keeping the substrate in atmosphere including oxygen gas, and (c) forming an insulating film on the thin semiconductor film with the substrate being kept in a pressure lower than an atmospheric pressure or inert gas atmosphere.

It is preferable that the atmosphere predominantly includes oxygen gas or the atmosphere includes only oxygen gas.

It is know that if silicon is left in atmosphere, there would be formed a natural oxidation film on an active surface of silicon. Since organic substances and/or metal particles floating in the air are absorbed into the natural oxidation film, the natural oxidation film formed in atmosphere is not suitable for formation of a clean interface, which is an object of the present invention.

In a conventional method of fabricating a bipolar transistor, in order to form silicon crystal by epitaxial growth, the following steps are carried out: removing a natural oxidation film through the use of hydrofluoric acid, forming a chemical oxide film through the use of heated solution of ammonia/$H_2O_2$/$H_2O$ or HCl/$H_2O_2$/$H_2O$, annealing at 1000 degrees centigrade or greater in an epitaxial growth furnace through the use of hydrogen gas, to thereby remove the chemical oxide film and resultingly form a clean surface of silicon, and growing a film.

However, when a step which is to be carried out at a temperature in the range of room temperature to 600 degrees centigrade has to be carried out, the high-temperature step in the above-mentioned conventional method can not be selected.

In addition, since a surface of a thin silicon film having been crystallized by laser beams has experienced a temperature of 1000 degrees centigrade or higher at which silicon would be molten, even in an order of nanoseconds, the surface is in quite active condition. Hence, even in a vacuous chamber, contaminants would be readily adhered to the surface, if atmosphere in the chamber is suitably controlled.

In contrast, in accordance with the present invention, highly purified oxygen gas is introduced into a chamber just after silicon has been crystallized by laser beams, to thereby form a natural oxidation film having a low concentration of contaminants. By forming such a natural oxidation film on a surface of silicon, it would be possible to prevent contaminants from being adhered to a surface of silicon in various chambers such as a chamber in which laser beam is radiated, a chamber through which a substrate is transferred to another chamber, or a chamber in which a film is formed.

If active gases such as radicals or ions are used for formation of a natural oxidation film, it would be possible to effectively form a natural oxidation film and establish hydrogen passivation. However, the use of those active gases might cause absorption of contaminants adhered to a wall of a chamber into a natural oxidation film, and thus, it is not preferable to use such active gases.

The inventor conducted the experience in which silicon dioxide films were formed on a silicon wafer through the use of oxygen gases A, B and C having different purities, and then, leakage current was measured for each one of oxygen gases A, B and C.

TABLE 1

|  | Purity of $O_2$ Gas (%) | Concentration of CO and $CO_2$ | Concentration of CmHn |
| --- | --- | --- | --- |
| Gas A | 99.7 | <2 ppm | <33 ppm |
| Gas B | 99.99 | <1.5 ppm | <1 ppm |
| Gas C | 99.9999 | <0.5 ppm | <0.3 ppm |

There were obtained current densities X1, X2 and X3, when an electric field of 5 MV/cm was applied to the samples in which the gases A, B and C were used, respectively. The relation among X1, X2 and X3 is X1>X2>X3.

Since carbon existing in a silicon dioxide film would cause current leakage, it is necessary to reduce a concentration of carbon. In addition, since metals such as Na, K or Li exist as movable ions in an oxide film, they would cause a threshold value to shift. Accordingly, gas having a high purity, such as $O_2$, $N_2O$, silane or disilane is necessary to be prepared for formation of a thin silicon film, oxidation of a surface of silicon or deposition of a silicon dioxide film.

Oxygen gas is fractionated from air through low temperature processing. In fractionation, hydrocarbon such as methane is all residual in oxygen gas because a boiling point of methane is higher than a boiling point of oxygen. Specifically, a boiling point of oxygen is −183 degrees centigrade, a boiling point of methane is −162 degrees centigrade, and a boiling point of nitrogen is −196 degrees centigrade. As a result, hydrocarbon in the air is condensed and residual in oxygen gas.

The following method is carried out in order to remove such hydrocarbon. First, porous catalyst such as Pt or Pd is heated. Then, hydrocarbon is made to react with oxygen to thereby form $CO_2$ and $H_2O$. Those $CO_2$ and $H_2O$ are absorbed into an absorber. As a result, it is possible to reduce a concentration of hydrocarbon in oxygen to 0.1 ppm or smaller, and concentrations of $CO_2$ and CO to 0.1 ppm or smaller. Hence, an apparatus for refining oxygen may be arranged upstream of a gas supplier which supplies gases to a process apparatus.

It is known that argon and nitrogen are residual in a step of fractionation. However, highly purified argon or highly purified nitrogen in an order of ppm does not cause any problems in the present invention. For instance, even if hydrogen, nitrogen or inert gas such as argon each having a purity of 99.9999% or higher is mixed with oxygen gas, such mixture gas does not cause nay problems.

As a result of the experiments the inventor conducted, the following was found out.

It is preferable that the atmosphere includes oxygen gas having purity of 99.999% or greater.

It is preferable that the atmosphere further includes hydrogen gas. having purity of 99.999% or greater.

It is preferable that the atmosphere further includes nitrogen gas having purity of 99.999% or greater.

It is preferable that the atmosphere further includes inert gas having purity of 99.999% or greater.

It is preferable that a process gas used for forming the insulating film has purity of 99.999% or greater.

It is preferable that a process gas used in the method includes hydrocarbon (CnHm) species having a total concentration of 1 ppm or smaller.

It is preferable that recrystallization in the step (a) is carried out through laser radiation.

There is further provided a method of fabricating a thin-film semiconductor device, including the steps, in sequence, of (a) introducing a substrate into a vacuous chamber, (b) introducing non-reactive gas into the chamber, (c) radiating laser beam to the substrate in the chamber, (d) introducing oxygen gas into the chamber, (e) exhausting the non-reactive gas and the oxygen gas until a pressure in the chamber is reduced down to a predetermined pressure, and (f) taking the substrate out of the chamber.

It is preferable that the non-reactive gas is selected from the group consisting of nitrogen gas, inert gas and hydrogen gas alone or in combination.

It is preferable that the method further includes the step (g) of radiating laser beam to a window through which laser beam is radiated into the chamber such that laser beam is not radiated to a completed region of the substrate, the step (g) being to be carried out between the steps (d) and (e).

It is preferable that the non-reactive gas is kept introduced into the chamber to cause the non-reactive gas to have a constant pressure.

It is preferable that the method further includes the step of heating the substrate.

There is still further provided a method of fabricating a thin-film semiconductor device, including the steps, in sequence, of (a) introducing a substrate into a vacuous chamber, (b) introducing non-reactive gas into the chamber, (c) radiating laser beam to the substrate in the chamber, (d) stopping introduction of the non-reactive gas into the chamber, (e) introducing oxygen gas into the chamber, (f) transferring the substrate from the chamber into a second chamber having the same internal pressure as that of the chamber.

It is preferable that the method further includes the steps of (g) radiating laser beam to a window through which laser beam is radiated into the chamber such that laser beam is not radiated to a completed region of the substrate, after the substrate has been transferred into the second chamber, and (h) exhausting the non-reactive gas and the oxygen gas until a pressure in the chamber is reduced down to a predetermined pressure.

In another aspect of the present invention, there is provided an apparatus for fabricating a thin-film semiconductor device, including (a) a first chamber which is capable of keeping the first chamber in various pressure atmospheres, (b) an energy beam radiator which radiates energy beam to at least a surface of a semiconductor thin film formed on a substrate, (c) a carrier which carries the substrate between the first chamber and a second chamber which is capable of accomplishing the same pressure atmosphere as that of the first chamber, (d) a first gas-introducer which introduces nitrogen gas or inert gas into the first chamber, (e) a gas pressure regulator which keeps the first and second chambers in a predetermined pressure atmosphere, (f) a second gas-introducer which introduces oxygen gas into the first chamber, and (g) a controller which controls operation of the energy beam radiator, the carrier, the first gas-introducer, the gas pressure regulator, and the second gas-introducer.

It is preferable that the controller controls operation of the energy beam radiator, the carrier, the first gas-introducer, the gas pressure regulator, and the second gas-introducer such that the following steps are carried out in this sequence: (a) adjusting pressures in the first and second chambers so that the pressures are almost equal to each other, (b) introducing the substrate into the first chamber from the second chamber, (c) introducing the nitrogen gas or inert gas into the first chamber, (d) radiating laser beam to the semiconductor thin film, and (e) introducing oxygen gas into the first chamber.

It is preferable that the apparatus further includes a heater for heating the substrate.

It is preferable that the controller controls the laser beam radiator such that laser beam is radiated to the first chamber without radiating laser beam to a completed region of the substrate, after the oxygen gas has been introduced into the first chamber.

In order to successively carry out a step in which laser is radiated at a pressure almost equal to atmospheric pressure, a step of carrying out CVD at a vacuum degree of a couple of Torrs, and a step of transferring a substrate between those steps without exposure of the substrate to atmosphere, it is preferable to reduce a difference in a pressure between chambers between which the substrate is transferred.

After laser beam has been radiated in nitrogen or inert gas atmosphere, but before nitrogen or inert gas is compulsively exhausted, oxygen gas is introduced into a chamber in which a laser beam is radiated, to thereby oxidize an active surface of silicon. At this time, silicon adhered to a window through which laser beam is introduced into the chamber is also oxidized, because silicon has an active surface. With oxygen being introduced into the chamber, the laser beam is introduced into the chamber such that the laser beam is not radiated to effective areas.

In particular, when ultra-violet ray is used as a laser beam, oxygen gas is decomposed by the ultra-violet ray, and at the same time, silicon having been adhered to the window and having not been oxidized by oxygen gas is heated. The thus decomposed, active oxygen reacts with the thus heated silicon to thereby form silicon dioxide, ensuring that reduction in a transmission rate of the laser beam is prevented.

The above-mentioned steps are carried out either in a condition in which the gas is sealed in the chamber or in a condition in which the gas is allowed to flow with the pressure being kept constant.

Then, the substrate is transferred from the chamber in which a laser beam is radiated to the substrate to a second chamber through which the substrate is transferred to another chamber. When the substrate is transferred in a vacuum condition, nitrogen or inert gas is stopped to be supplied into the chamber concurrently with stopping of introduction of oxygen gas and stopping of radiation of the laser beam, to thereby much exhaust the gas.

After it has been confirmed that the chambers are in almost the same pressure atmosphere, a gate valve separating the chambers is made open, and the substrate is transferred from the previous chamber to the second chamber.

When the substrate is transferred in oxygen atmosphere, the second chamber is caused to have a predetermined pressure in advance by inert gas, nitrogen gas or oxygen gas all having a high purity, alone or in combination. Then, the chamber in which the laser beam is radiated is caused to be in oxygen atmosphere, and the chamber is caused to have the same pressure as that of the second chamber. Thereafter, the gate valve separating the chambers from each other is made open, and the substrate is transferred to the second chamber.

Thus, it would be possible to prevent contaminants such as metal or carbon from adhering to a surface of a silicon film formed on a substrate, and prevent reduction in a transmission rate of laser beam through a laser-introducing window.

The above and other objects and advantageous features of the present invention will be made apparent from the following description made with reference to the accompanying drawings, in which like reference characters designate the same or similar parts throughout the drawings.

BRIEF DESCRIPTION OF THE DRAWINGS

FIGS. 13A to 13I are cross-sectional views of a thin-film transistor, showing respective steps of another method of fabricating the same.

DESCRIPTION OF THE PREFERRED EMBODIMENTS

Preferred embodiments in accordance with the present invention will be explained hereinbelow with reference to drawings.

Figure 1A:
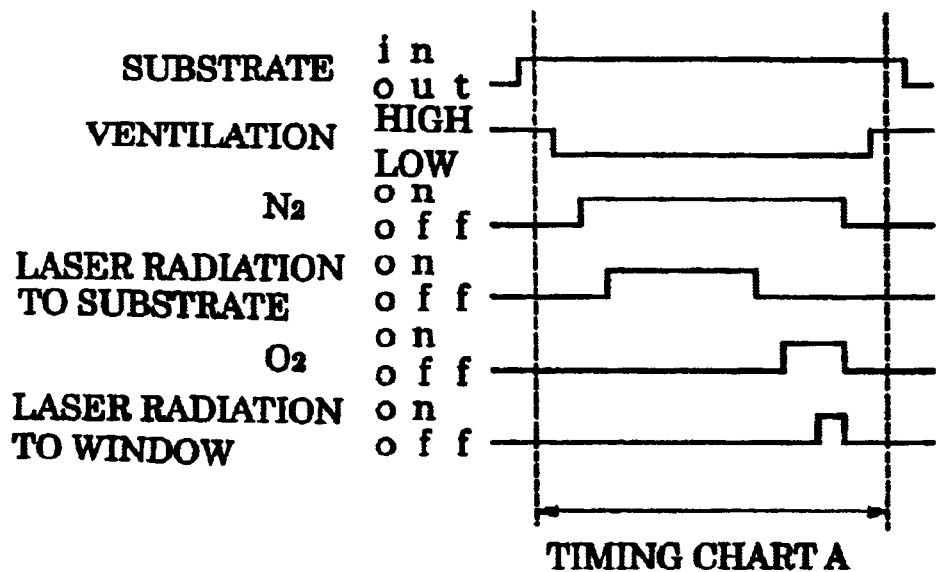
FIG. 1A is a timing chart of processing a substrate in a method in accordance with the embodiment of the present invention.
Figure 2:
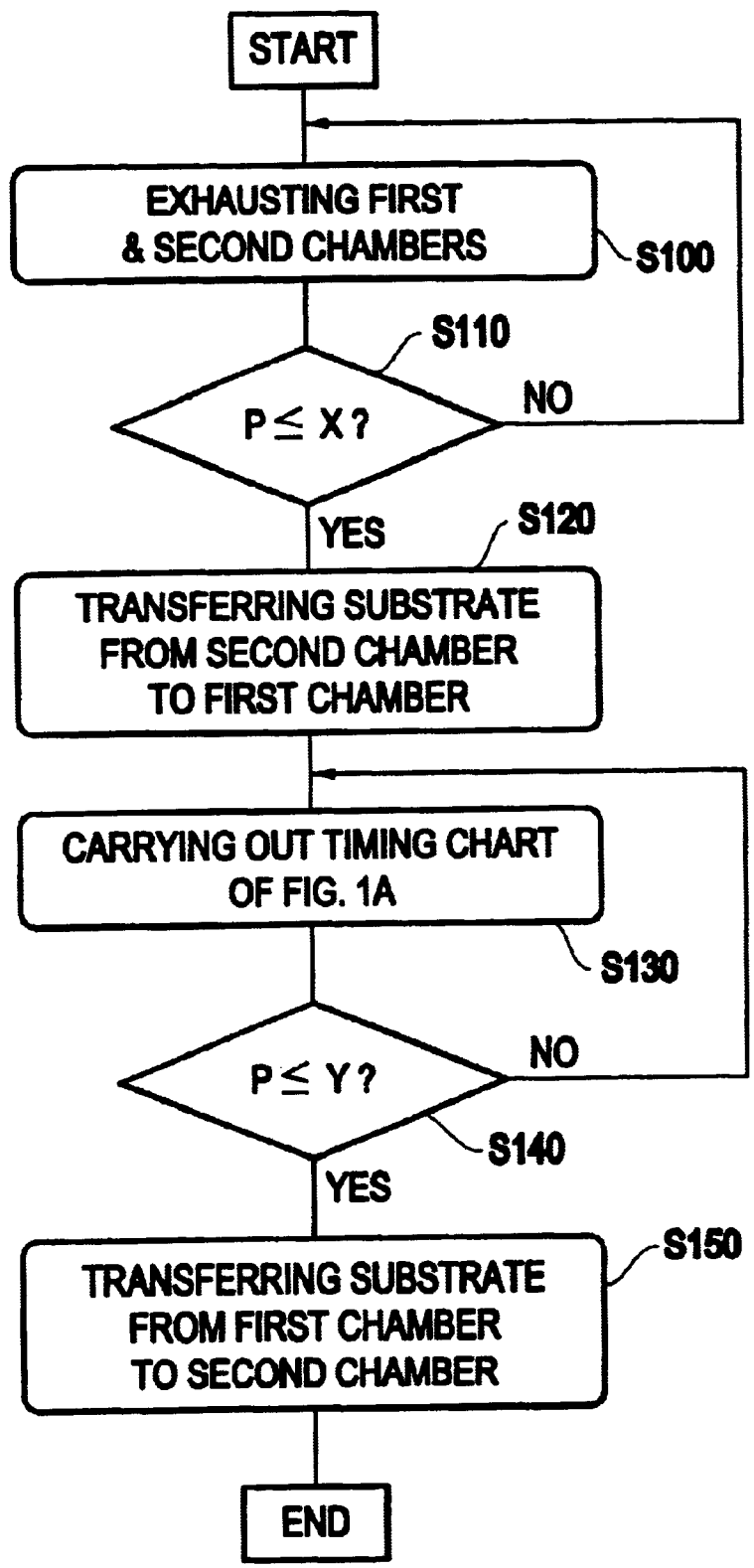
FIG. 2 is a flow-chart of processing a substrate in a method in accordance with the embodiment of the present invention.

FIG. 1A is a timing chart of processing a substrate in a method in accordance with the embodiment of the present invention, and FIG. 2 is a flow-chart of processing a substrate in a method in accordance with the embodiment of the present invention.

With reference to FIG. 2, a first chamber in which a laser beam is radiated to a substrate and a second chamber through which the substrate is transferred to another chamber are both exhausted, in step S100.

Then, the first and second chambers are checked as to whether pressures P in the chambers are equal to or smaller than a predetermined pressure X, in step S110.

If the pressures P are not equal to or smaller than the predetermined pressure X (NO in step S110), the first and second chambers are exhausted again, in step S100 If the pressures P are equal to or smaller than the predetermined pressure X (YES in step S110), a substrate is transferred to the first chamber from the second chamber.

Then, a gate valve separating the first and second chambers from each other is closed to thereby shut gas communication therebetween. Then, nitrogen, inert gas such as argon or hydrogen gas alone or in combination is introduced into the first chamber in step S130. That is, the steps are carried out in accordance with the timing chart illustrated in FIG. 1A, as follows.

It is preferable not to stop exhausting the gas to thereby keep the first chamber in a constant nitrogen pressure. As an alternative, a valve through which gas is introduced into the first chamber may be closed when the first chamber reaches a predetermined pressure after exhausting the gas or introducing gas thereinto.

Then, a stage on which the substrate is lying is moved to a predetermined position. Then, a laser beam is radiated to the substrate, after a pressure in the first chamber reaches to a predetermined pressure, and a heater for heating the substrate reaches a predetermined temperature.

Then, a laser beam is radiated to a desired area of the substrate for recrystallization by moving the stage or laser beam. Then, a laser beam is radiated to a window through which the laser beam is introduced into the first chamber such that a laser beam is not radiated to an effective area of the substrate by moving the stage or through the use of a light-shutter equipped in a vacuum equipment.

Radiation of a laser beam to the window, introduction of oxygen gas into the first chamber, and introduction of nitrogen gas into the first chamber are stopped concurrently or in turn to thereby exhaust the gas.

Then, it is checked whether pressures P in the first and second chambers are equal to or smaller than a predetermined pressure Y, in step S140.

If the pressures P are not equal to or smaller than a predetermined pressure Y (NO in step S140), the first and second chambers are exhausted again until the pressures P reach the predetermined pressure Y. If the pressures P are equal to or smaller than a predetermined pressure Y (YES in step S140), a gate valve between the first and second chambers is made open, and the substrate is transferred to the second chamber from the first chamber.

Figure 1B:
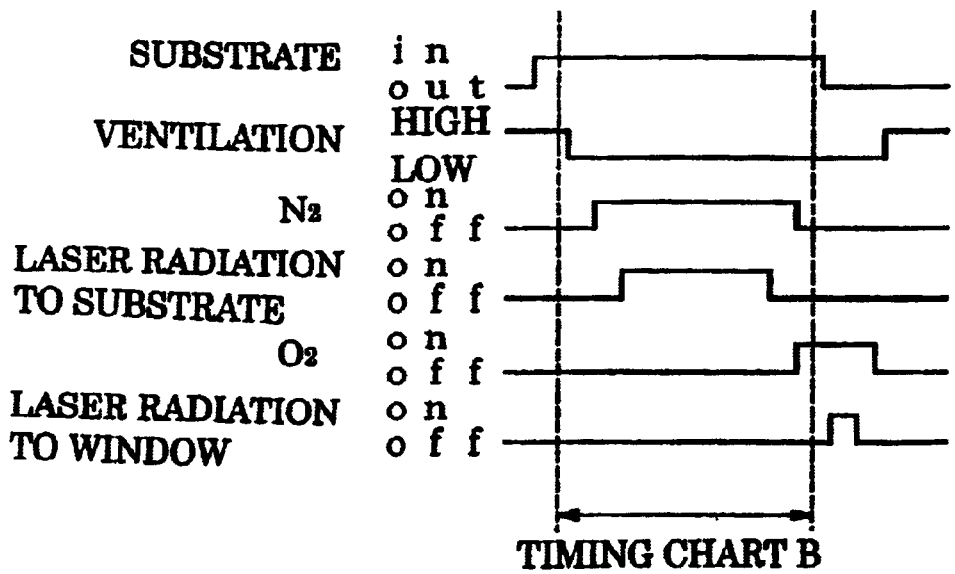
FIG. 1B is another timing chart of processing a substrate in a method in accordance with the embodiment of the present invention.
Figure 3:
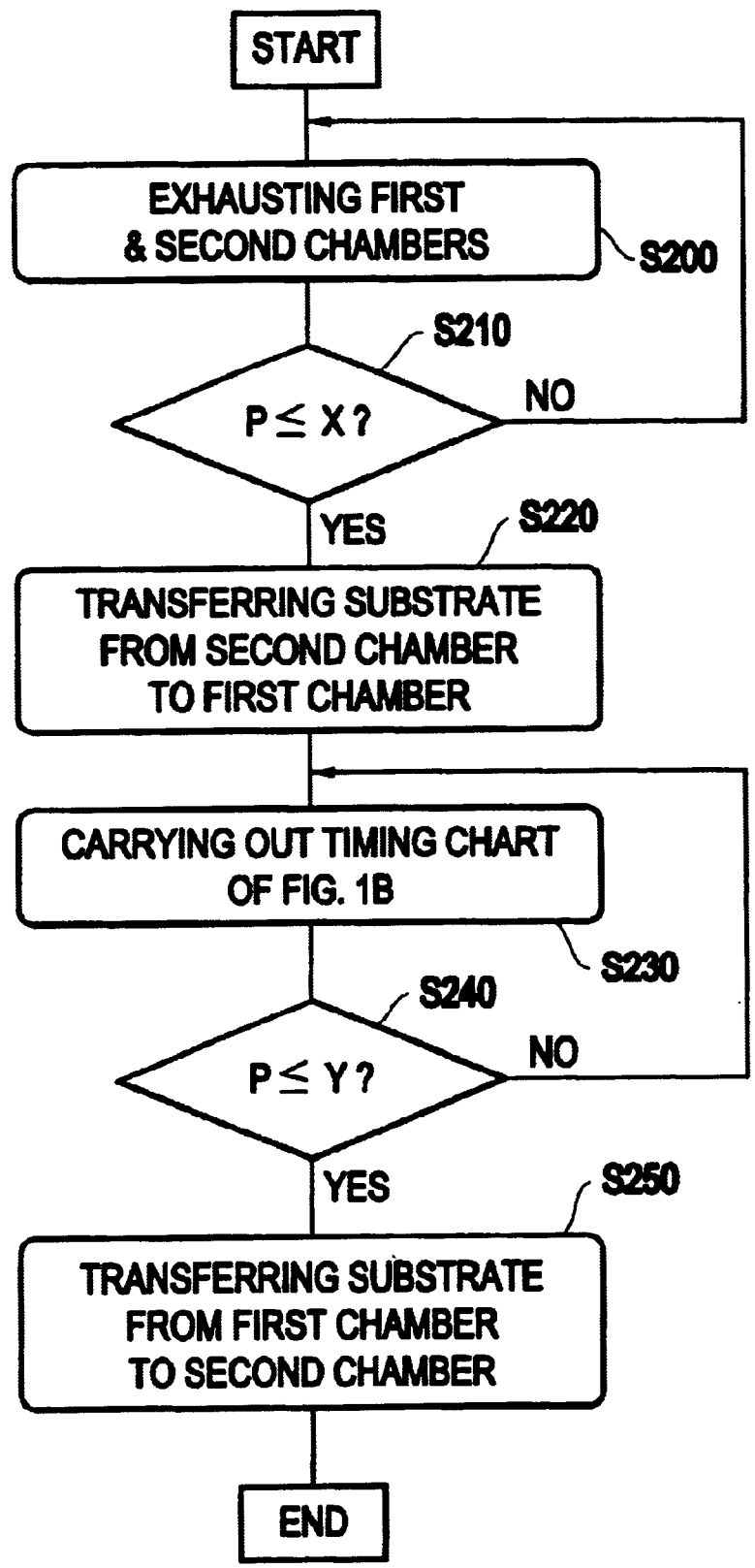
FIG. 3 is another flow-chart of processing a substrate in a method in accordance with the embodiment of the present invention.

FIG. 1B is another timing chart of processing a substrate in a method in accordance with the embodiment of the present invention, and FIG. 3 is another flow-chart of processing a substrate in a method in accordance with the embodiment of the present invention.

With reference to FIG. 3, a first chamber in which a laser beam is radiated to a substrate and a second chamber through which the substrate is transferred to another chamber are both exhausted, in step S200.

Then, the first and second chambers are checked as to whether pressures P in the chambers are equal to or smaller than a predetermined pressure X, in step S210.

If the pressures P are not equal to or smaller than the predetermined pressure X (NO in step S210), the first and second chambers are exhausted again, in step S200. If the pressures P are equal to or smaller than the predetermined pressure X (YES in step S210), a substrate is transferred to the first chamber from the second chamber.

Then, a gate valve separating the first and second chambers from each other is closed to thereby shut gas communication therebetween. Then, nitrogen, inert gas such as argon or hydrogen gas alone or in combination is introduced into the first chamber in step S230. That is, the steps are carried out in accordance with the timing chart illustrated in FIG. 1B, as follows.

Then, a stage on which the substrate is lying is moved to a predetermined position. Then, a laser beam is radiated to the substrate, after a pressure in the first chamber reaches to a predetermined pressure, and a heater for heating the substrate reaches a predetermined temperature.

Then, a laser beam is radiated to a desired area of the substrate for recrystallization by moving the stage or laser beam. Then, introduction of nitrogen gas into the first chamber is stopped, and introduction of oxygen gas into the first chamber is started.

Then, it is checked whether pressures P in the first and second chambers are equal to or smaller than a predetermined pressure Y, in step S240.

If the pressures P are not equal to or smaller than a predetermined pressure Y (NO in step S240), the first and second chambers are exhausted again until the pressures P reach the predetermined pressure Y. If the pressures P are equal to or smaller than a predetermined pressure Y (YES in step S240), a gate valve between the first and second chambers is made open, and the substrate is transferred to the second chamber from the first chamber.

Then, a laser beam is radiated to a window through which the laser beam is introduced into the first chamber such that a laser beam is not radiated to an effective area of the substrate.

Radiation of a laser beam to the window, introduction of oxygen gas into the first chamber, and introduction of nitrogen gas into the first chamber are stopped concurrently or in turn to thereby exhaust the gas.

In the above-mentioned embodiments, oxygen gas, inert gas, nitrogen gas and hydrogen gas all have a purity of 99.9999%.

Figure 4:
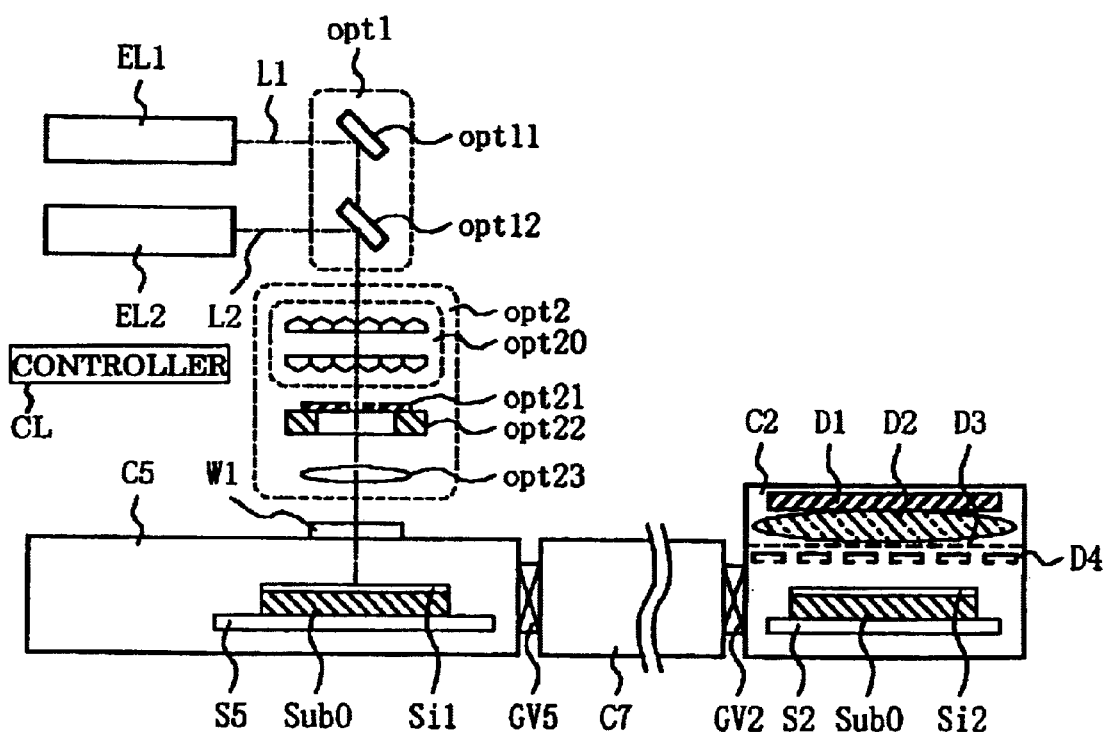
FIG. 4 is a cross-sectional view of an apparatus of forming a thin-film semiconductor device in accordance with the embodiment of the present invention.

FIG. 4 is a side view of an apparatus of forming a thin semiconductor film in accordance with the first embodiment of the present invention.

The illustrated apparatus includes a plasma CVD chamber C2, a chamber C5 in which a laser beam is radiated to a substrate, and a chamber C7 through which the substrate is transferred between the chambers C2 and C5. The chamber C2 is connected to the chamber C7 through a first gate valve GV2, and the chamber C5 is connected to the chamber C7 through a second gate valve GV5. The substrate can be transferred from the chamber C2 to the chamber C5 through the chamber C7 in vacuum, inert gas, nitrogen, hydrogen or oxygen atmosphere and in a high vacuum degree condition or in a low or high pressure condition without exposure of the substrate to atmosphere.

In the chamber C5, a substrate Sub0 lies on a substrate stage S5 by means of a chuck unit (not illustrated). The substrate stage S5 can be heated to about 400 degrees centigrade.

In the chamber C2, the substrate Sub0 lies on a substrate holder S2 which can be heated to about 400 degrees centigrade.

In the first embodiment, a thin silicon film Si1 is formed on the glass substrate Sub0. A laser beam is radiated to the thin silicon film Si1 in the chamber C5, and resultingly, the thin silicon film Si1 is turned into a thin crystalline silicon film Si2. Then, the substrate Sub0 on which the thin crystalline silicon film Si2 lies is transferred into the chamber C2.

Laser beams emitted from first and second excimer lasers EL1 and EL2 pass along first and second beam lines L1 and L2, and reach a surface of the substrate through an optical system Opt1 which synthesizes laser beams to each other, a mirror Opt11, a transparent mirror Opt12, an optical system Opt2 which radiates a laser beam to an object, a homogenizer Opt 20, an optical mask Opt2 fixed to an optical mask stage Opt22, an optical apparatus Opt23 for projection, and a laser introduction window W1.

Though the first embodiment is designed to include two excimer lasers EL1 and EL2, there may be used any number of excimer lasers. In place of the excimer laser, there may be used a $CO_2$ laser, a pulse laser such as YAG laser, or CW light source such as an argon laser.

In the plasma CVD chamber C2, a region D2 in which plasma is generated, defined by RF electrode D1 and a plasma-confinement electrode D3, is positioned away from a region in which the substrate is located.

A silicon dioxide film can be formed on the substrate by introducing $O_2$ and He gases and silane gas into the region D2 through a process gas introducer D4.

The apparatus further includes a controller CL controlling operation of the above-mentioned parts constituting the apparatus.

For instance, the controller CL controls an operation of the apparatus by adjusting pressures in the chambers C2, C5 and C7 so that those pressures are almost equal to one another, introducing the substrate into the chamber C5 from the chamber C2 through the chamber C7, introducing nitrogen gas or inert gas into the chamber C5, radiating a laser beam to the thin silicon film, and introducing oxygen gas into the chamber C5.

Figure 5:
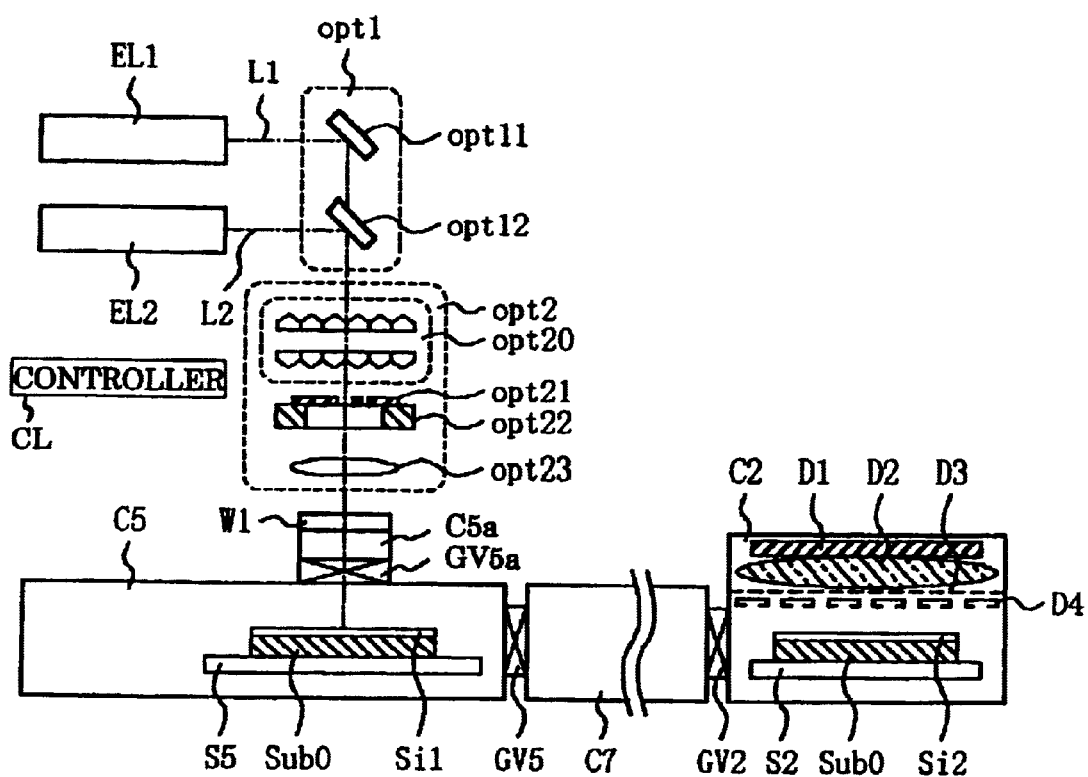
FIG. 5 is a cross-sectional view of another apparatus of forming a thin-film semiconductor device in accordance with the embodiment of the present invention.

FIG. 5 illustrates an apparatus of forming a thin semiconductor film, in accordance with the second embodiment. In comparison with the apparatus in accordance with the first embodiment, illustrated in FIG. 4, the apparatus in accordance with the second embodiment further includes an oxidation chamber C5a and a gate valve GV5a through which the oxidation chamber C5a is connected to the chamber C5.

The gate valve GV5a allows the laser-introduction window W1 to be away from the chamber C5. Oxygen and other gases can be introduced into the chamber C5 independently of one another. Hence, it is possible to radiate the laser beam to the laser-introduction window W1 without radiating the laser beam to the substrate, by radiating the laser beam in the oxidation chamber C5a.

Since the gate valve GV5a acts as a shutter to the substrate in the chamber C5, it would be possible to oxidize silicon adhering to a surface of the laser-introduction window W1 by radiating the laser beam to the laser-introduction window W1, for instance, during a period of time in which the substrate waits to be taken out of the chamber C5. One or both of the beams emitted from the first and second excimer lasers EL1 and EL2 may be radiated to the chamber C5. It is also possible to lengthen a lifetime of expensive optical systems and radiate beams having a uniform intensity profile to the laser introduction window W by partially or wholly removing the optical mask Opt21 and the projection unit Opt23.

Figure 6:
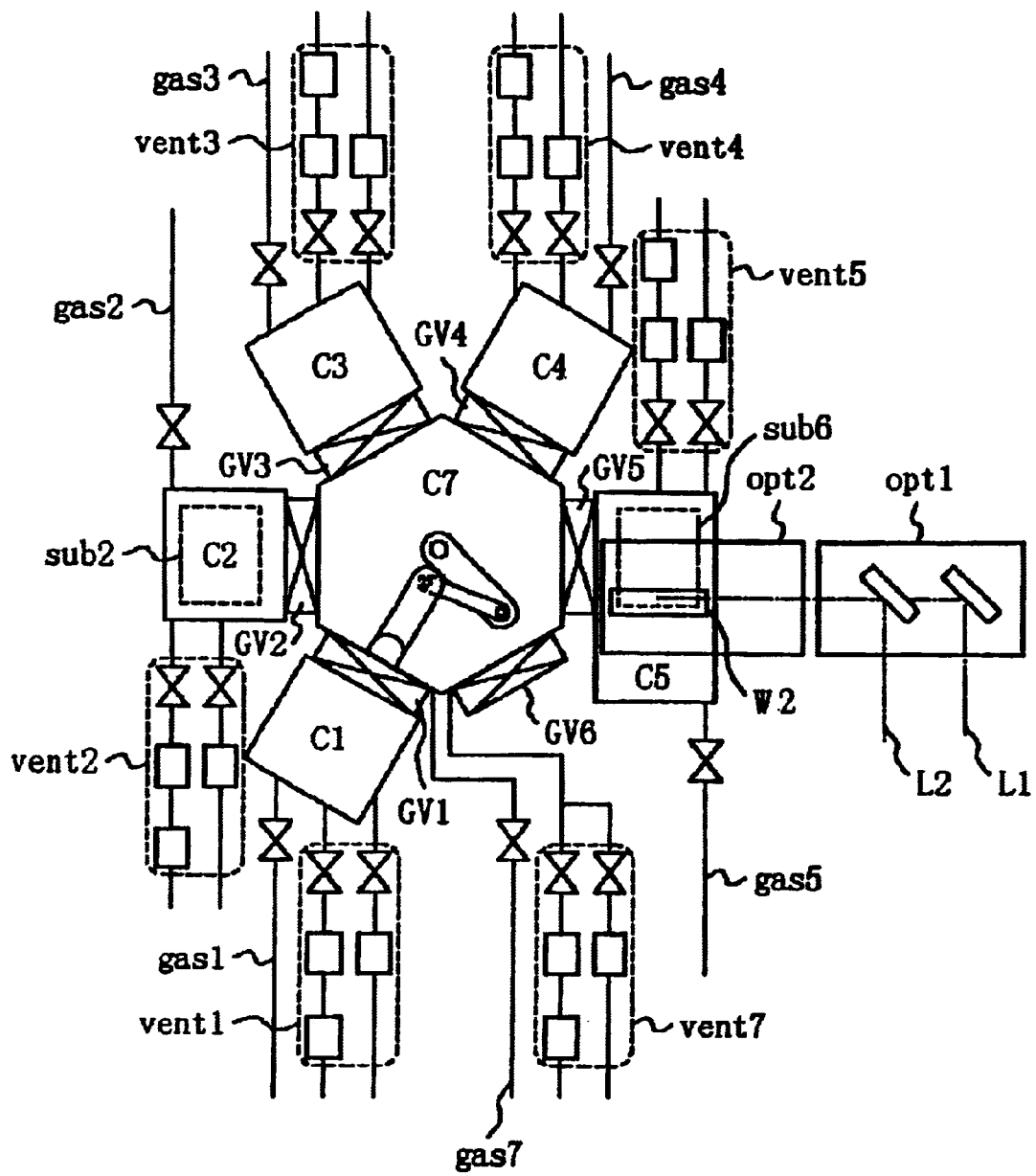
FIG. 6 is a top view of an apparatus of forming a thin-film semiconductor device in accordance with the embodiment of the present invention.

FIG. 6 is a plan view of the apparatus for forming a thin semiconductor film. The apparatus includes a central chamber C7 through which a substrate is transferred to another chamber. The apparatus further includes a loading and unloading chamber C1, a plasma CVD chamber C2, a chamber C3 in which the substrate is heated, a chamber C4 in which hydrogen plasma is generated, and a chamber C5 in which a laser beam is radiated to the substrate. These chambers C1 to C5 are connected to the central chamber C7 through gate valves GV1 to GV5, respectively.

Laser beams coming along first and second beam lines L1 and L2 are radiated onto a surface of the substrate through an apparatus Opt1 for synthesizing laser beams to each other, an apparatus Opt2 for radiating laser beams, and a laser-introduction window W2.

Gas suppliers gas1 to gas7 and ventilation devices vent1 to vent7 are connected to the chambers C1 to C7, respectively, for introducing desired gas species, establishing a desired process pressure, exhausting gases, and making a vacuum condition. Substrates sub2 and sub6 are horizontally laid, as indicated with broken lines.

The apparatus further includes a controller CL which controls an operation of other parts constituting the apparatus.

Figure 7:
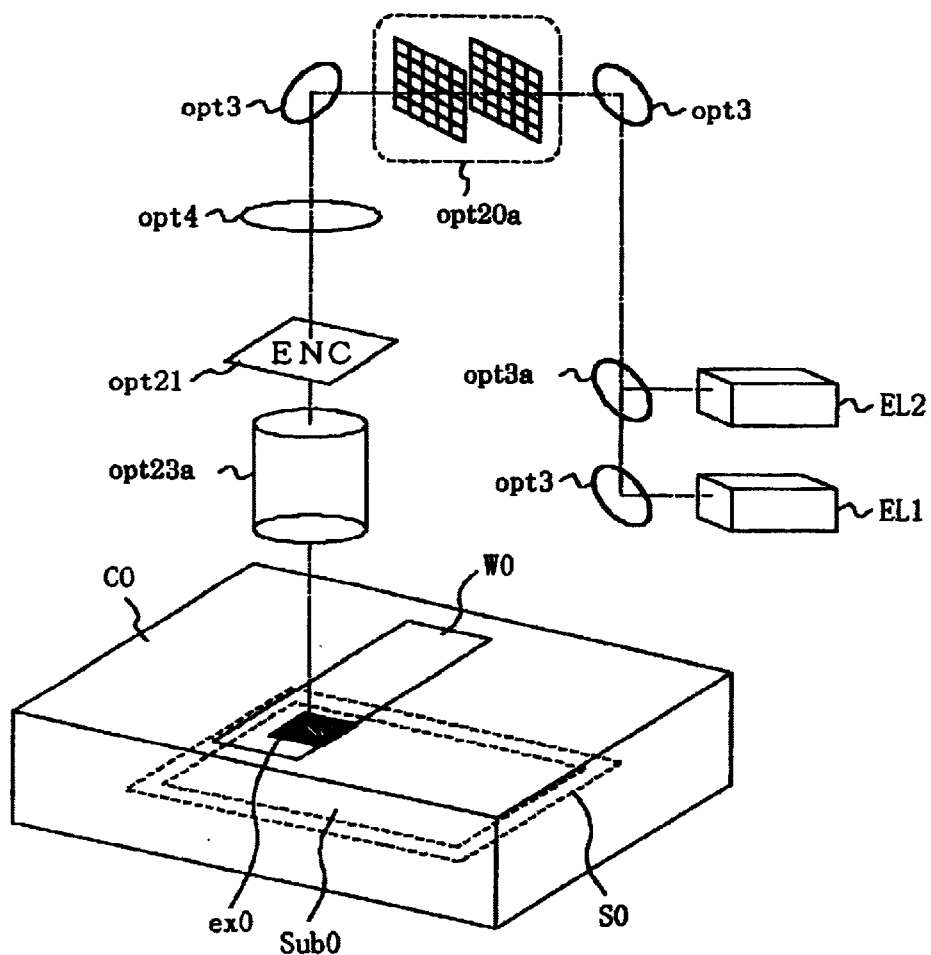
FIG. 7 is a perspective view of an apparatus of radiating excimer laser beam.
Figure 7:
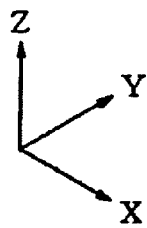
Figure 7:
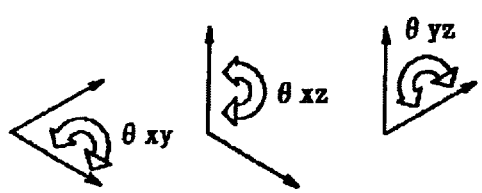

FIG. 7 is a perspective view of a chamber in which a laser beam is radiated to a substrate.

A pulsed ultra-violet beam emitted from first and second excimer lasers EL1 and EL2 is introduced into a homogenizer Opt2Oa through mirrors Opt3 and Opt3a, and lens Opt4. Though the illustrated chamber is designed to have two excimer lasers as a laser source, it should be noted that the chamber may have any number of excimer lasers.

An optical mask Opt21 shapes the beam such that an intensity profile of the beam has desired uniformity, for instance, distribution of ±5% in a plane. Since an intensity profile and total energy of original beams emitted from an excimer laser may vary at each of periods between pulses, it is preferable for the chamber to have a unit for uniformizing a beam intensity on the optical mask Opt 21. The homogenizer Opt2Oa is generally comprised of a fly-eye lens or a cylindrical lens.

The beams having an optical pattern formed by the optical mask Opt21 are radiated to a substrate Sub0 lying in a vacuum chamber C0 through a stepper Opt23a and a laser-introduction window W0.

The substrate lies on a substrate stage S0. A laser beam having a pattern can be radiated to a desired region, for instance, a region ex0 to which a pattern is to be transferred, by moving the substrate stage S0. Though FIG. 7 illustrates an optical system for projection in a reduced scale, there may be used an optical system for projection in an equal scale or in an increased scale.

A laser beam may be radiated to a desired region in the substrate by moving the substrate stage S0 in X-Y plane. The above-mentioned optical mask is fixed on a mask stage (not illustrated). It is also possible to radiate a laser beam to a desired region in the substrate by moving the mask stage.

Hereinbelow is explained an example of a method of radiating a laser beam having a desired pattern, to a substrate in desired conditions. It is necessary to effect slight adjustment in order to properly set an optical axis. Hence, hereinbelow is explained a method of adjusting a position of a substrate, after an optical axis has been properly set.

A position of a surface to an optical axis is determined by amending a position of the surface in a focal direction or Z-axis direction and perpendicularity to an optical axis. Hence, perpendicularity to an optical axis is amended by adjusting a direction θxy in which tilting is amended, a direction θxz in which tilting is amended, and a direction θyz in which tilting is amended, among the direction θxy, the direction θxz, the direction θyz, a direction X in which a region to be exposed to a laser beam is moved, a direction Y in which a region to be exposed to a laser beam is moved, and a direction Z in which a focus is adjusted. In addition, a surface of a substrate to which a laser beam is to be radiated is positioned in accordance with a depth of focus of an optical system, by adjusting the direction Z.

Figure 8:
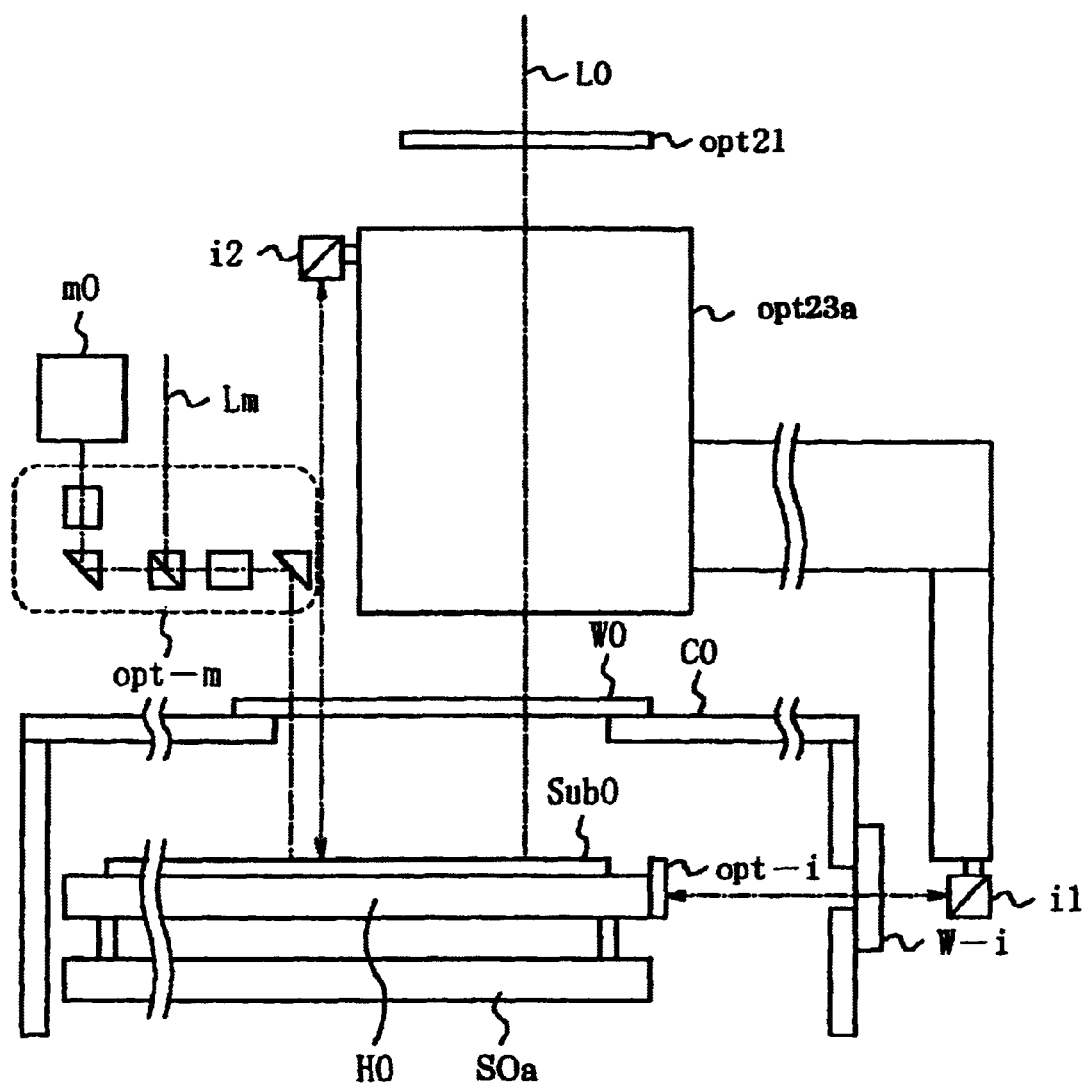
FIG. 8 is a side view of an apparatus of radiating excimer laser beam.

FIG. 8 is a side view of an apparatus for adjusting alignment of a substrate. An optical mask Opt21, a stepper Opt23a and a laser-introduction window W0 are arranged relative to an exposure axis L0, as illustrated in FIG. 8.

A substrate Sub0 is placed on a heater H0 having a unit of absorbing a substrate thereto. The heater H0 is fixed on a substrate XYZθxyθxzθyz stage S0a in a vacuum chamber C0. Though there is used a vacuum chamber, it is preferable that a laser beam is radiated to the substrate in inert gas, hydrogen, oxygen or nitrogen atmosphere. A pressure in such atmosphere may be almost equal to atmospheric pressure. By using the heater H0 having a unit of absorbing a substrate thereto, the substrate can be heated at a temperature in the range of room temperature to about 400 degrees centigrade while a laser beam is radiated to the substrate.

By equalizing a pressure of the atmosphere to about an atmospheric pressure, the substrate can be adsorbed to a vacuum chuck. This means that misregistration can be prevented even if the substrate stage is moved in the chamber, and that the substrate can be fixed to the substrate stage, even if the substrate is curved or deformed. In addition, it is also possible to minimize deviation of a depth of focus, caused by curvature and deformation of the substrate which occur when heated.

Laser interferometers i1 and i2 measures alignment of a substrate and a position of a substrate in a Z-axis direction through a measurement window W-I and a measurement mirror Opt-i. Alignment of a substrate is measured by observing an alignment mark formed on a substrate, by means of an off-axis microscope, a light source Lm for a microscope, and a microscope device Opt-m. A desired position at which the substrate is exposed to a laser beam can be measured based on data indicative of a position of the substrate, provided by the laser interferometers i1 and i2.

Though FIG. 8 shows an off-axis method, there may be used a through the lens method or a through the mask (or reticle) method. In addition, an error in measurement may be standardized by determining a liner coordinate through method of least squares, based on a plurality of measured positions.

Figure 9:
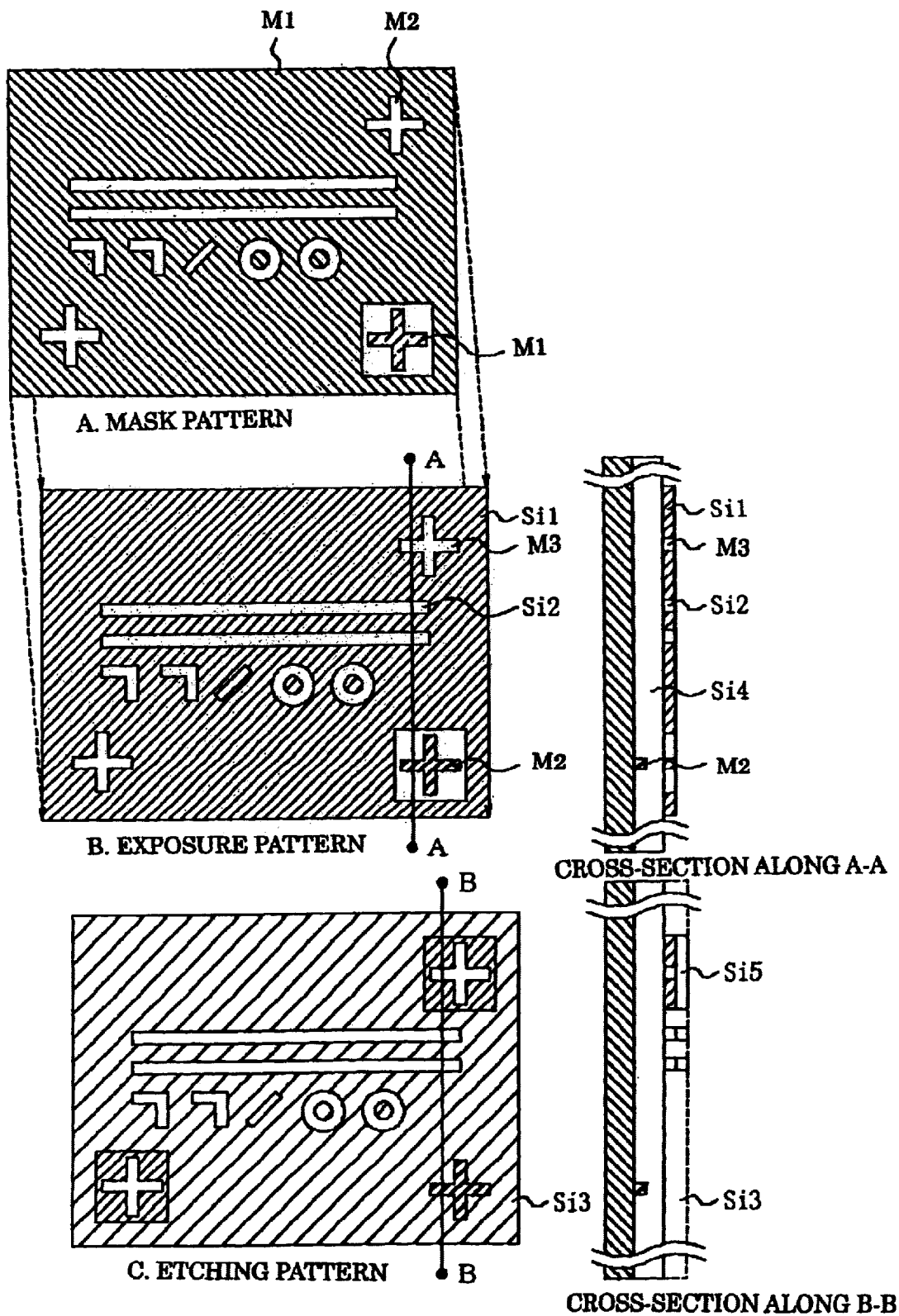
FIG. 9 is a top view showing mask patterns used in an apparatus of radiating excimer laser beam.

FIG. 9 shows a positional relation between a mask pattern and an alignment mark. A mask is comprised of a region M1 through which a substrate is not exposed to a laser beam and a region M2 through which a substrate is exposed to a laser beam.

For instance, when an excimer laser is used as a laser source, a metal film such as aluminum, chromium or tungsten, which absorbs a ultra-violet ray and a dielectric multi-layered film which reflects a ultra-violet ray are formed on a quartz substrate through which a ultra-violet ray passes, and those layers are patterned through the use of photolithography and etching.

A silicon film is exposed to a ultra-violet ray in accordance with a pattern, which is indicated as a white area in FIG. 9–A, and as a result, there are formed exposed silicon areas Si2 in non-exposed silicon areas Si1, as illustrated in FIG. 9–B. When a silicon film is exposed to a ultra-violet ray, it is possible to expose a predetermined position on a silicon film to a ultra-violet ray by aligning the mark M1 of the mask with the mark M2 of the substrate before exposure of the silicon film to a ultra-violet ray.

In a method of fabricating a thin-film transistor including the above-mentioned thin silicon film, when it is necessary to position a mask in the first step, that is, an alignment mark is not formed on a mask, it would be possible to form an alignment mark making use of an optical color difference between amorphous silicon and crystal silicon, by exposing an exposure mark M3 to a laser beam at the same time when a thin silicon film is exposed to a laser film. Hence, it is possible to form a desired device such as a transistor in a desired area having been reformed, by carrying out lithography in later steps on the basis of the thus formed alignment mark.

After a step of exposing the thin silicon film to a laser beam has been finished, a silicon dioxide film is formed on the thin silicon film, and a desired region in the silicon layer is etched for removal, as illustrated in FIG. 9–C.

The silicon film and the silicon dioxide film are etched for removal in a region Si3. Silicon dioxide films Si4 and Si5 are formed on the non-exposed silicon area Si1 and the exposed silicon area Si2 in multi-layered structure. By forming an island comprised of a silicon film covered with an oxide film, it is possible to form an alignment mark necessary for alignment in forming channel/source/drain regions of a thin film transistor and in later steps.

Figure 10A:
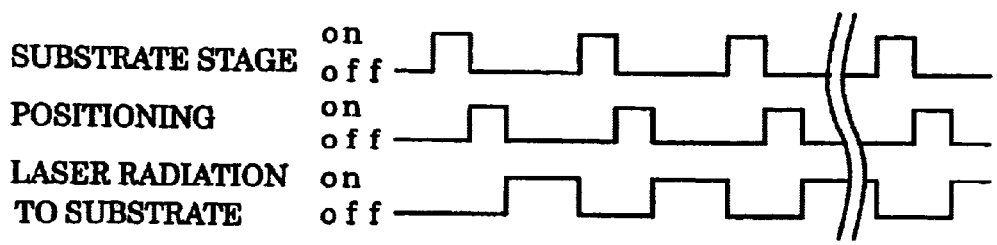
FIG. 10A is a timing chart showing an operation of a stage used in an apparatus of radiating excimer laser beam.
Figure 10B:
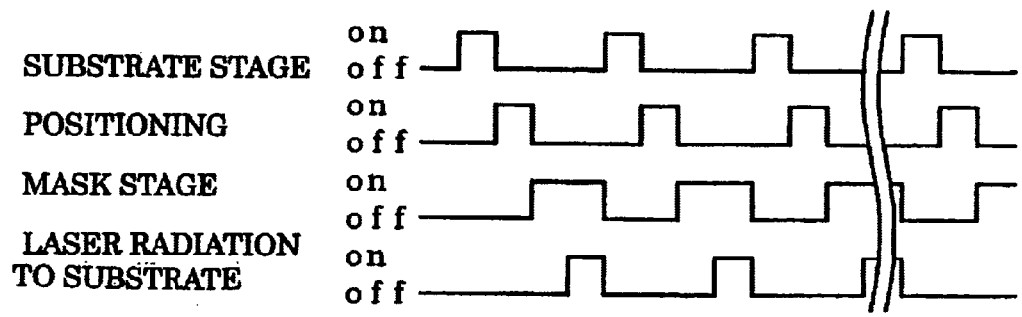
FIG. 10B is another timing chart showing an operation of a stage used in an apparatus of radiating excimer laser beam.

FIGS. 10A and 10B show examples 1 and 2 of a timing chart of an operation.

In example 1, a substrate is moved to a desired position by an operation of a substrate stage. Then, a focus is adjusted and an alignment step is carried out to thereby accurately position a substrate at a predetermined position at which the substrate is exposed to a laser beam. For instance, the substrate is positioned at a predetermined position such that an error in positioning is within an allowable range of about 0.1 $\mu$m to 100 $\mu$m.

After positioning the substrate, a laser beam is radiated to the substrate. Then, the substrate is moved for next exposure. Then, a laser beam is radiated to a predetermined region of the substrate. Then, the substrate is exchanged to a next substrate.

The same steps as the above-mentioned steps are carried out to the next substrate.

In example 2, a substrate is moved to a desired position by an operation of a substrate stage. Then, a focus is adjusted and an alignment step is carried out to thereby accurately position a substrate at a predetermined position at which the substrate is exposed to a laser beam. For instance, the substrate is positioned at a predetermined position such that an error in positioning is within an allowable range of about 0.1 $\mu$m to 100 $\mu$m.

After positioning the substrate, a mask stage starts moving. In order to avoid dispersion in movement distance of the mask stage, a laser beam is radiated to the substrate after movement of the mask stage. By movement of the mask stage, the substrate is exposed to a laser beam at a position away from an alignment position. Hence, an offset caused by that has to be taken into consideration.

It is also possible to start driving a laser source earlier than radiation of a laser beam to a substrate, and open a shutter to thereby radiate a laser beam to a substrate when an output intensity of the laser source has stabilized. In particular, in a method where an excimer laser is used as a laser source, and oscillation and stop of a laser beam are repeated, first tens of pulses are known to be quite unstable. Hence, if it is intended to stop radiation of those unstable laser pulses, there may be selected a system where a laser beam is interrupted in accordance with movement of the mask stage.

Then, the substrate is moved for next exposure. Then, a laser beam is radiated to a predetermined region of the substrate. Then, the substrate is exchanged to a next substrate.

The same steps as the above-mentioned steps are carried out to the next substrate.

A laser beam of 1 mm×50 $\mu$m was scanned to a thin amorphous silicon film having a thickness of 75 nm, at a pitch of 0.5 $\mu$m. One laser source was used. A laser radiation intensity was set at 470 mJ/cm$^2$ at a surface of the silicon film. As a result, there was obtained a thin mono-crystalline silicon film extending in a direction in which the laser beam was scanned.

Then, a laser beam was radiated to the silicon film from a second laser source at a laser radiation intensity of 150 mJ/cm$^2$ at a pitch of 1.0 $\mu$m when 100 nsec had passed after first radiation of a laser beam from the first laser source. As a result, there was obtained a thin mono-crystalline silicon film extending in a direction in which the second laser beam was scanned. The resultant crystal silicon film had a trap level density smaller than $1\times10^{12}$ cm$^{-2}$.

Figure 11:
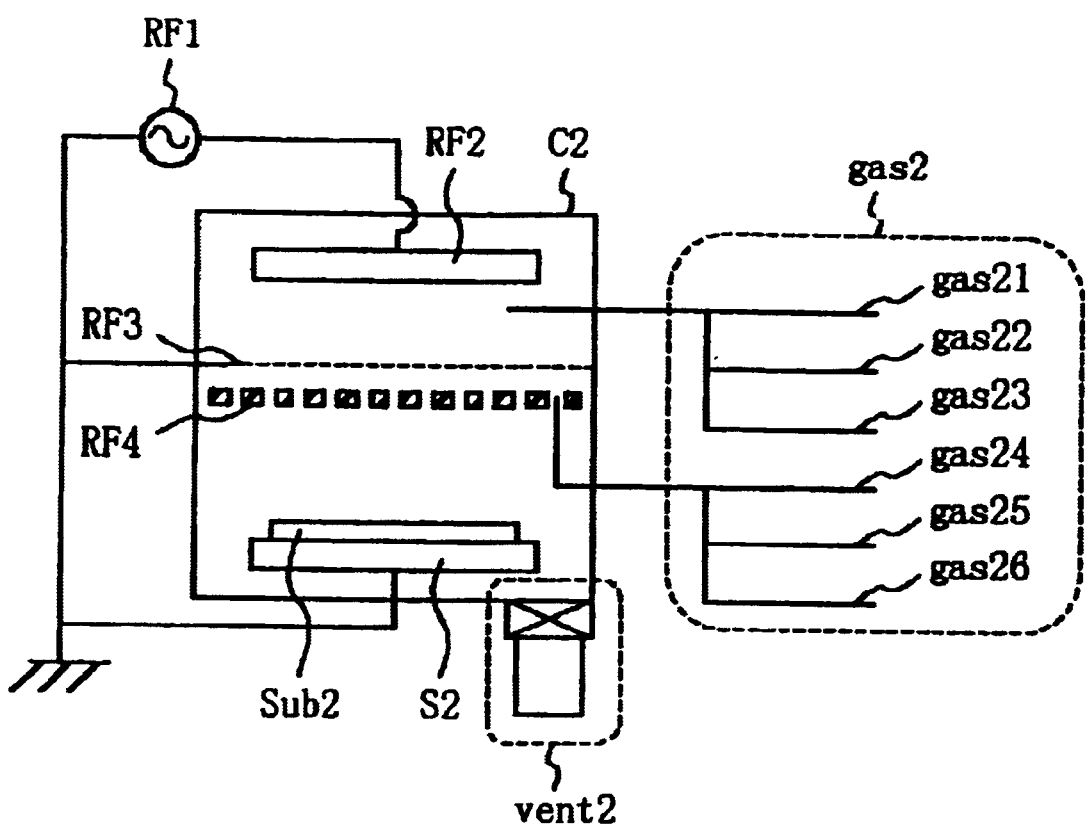
FIG. 11 is a cross-sectional view of a plasma-CVD chamber.

FIG. 11 illustrates the plasma CVD chamber C2. Electric power is supplied to a radio-frequency electrode RF2 from a radio-frequency power source RF 1. Herein, it is preferable for the radio-frequency power source RF1 to emit a radio-frequency of 13.56 MHz or higher. Plasma is generated between an electrode RF3 and the radio-frequency electrode RF2. The electrode RF3 is formed with a plurality of slits through which gas passes. Radicals generated by plasma passes through the slits of the electrode RF3 to enter a space in which a substrate Sub2 is arranged.

Another gas is introduced into the chamber C2 through a gas supplier RF4 without exposure to plasma. As a result, a thin film is formed on the substrate Sub2, after gas phase reaction has occurred.

A substrate holder S2 on which he substrate Sub2 is fixed can be heated to a temperature in the range of room temperature to 500 degrees centigrade by means of a heater (not illustrated). As illustrated, oxygen radicals are made to react with silane gas for formation of a silicon dioxide film through the use of a ventilation unit Vent2, and a gas supplier Gas2 including an oxygen line Gas21, a helium line Gas22, a hydrogen line Gas23, a silane line Gas24, a heilum line Gas25, and an argon line Gas26.

A silicon dioxide film was formed in the following conditions.

Temperature of a substrate: 300 degrees centigrade

Pressure: 0.1 Torr

RF power: 100 W

Silane flow rate: 10 sccm

Oxygen flow rate: 400 sccm

Helium flow rate: 400 sccm

There was obtained a silicon dioxide film having superior characteristic, specifically, a density of electric charge of fixed oxide film of $5 \times 10$ cm$^{-2}$.

If a ratio of oxygen flow rate to silane flow rate is increased, it would be possible to obtain a silicon dioxide film having a greater density of electric charge of fixed oxide film.

Though FIG. 11 illustrates a parallel plate type RF plasma CVD apparatus, there may be selected a method in which plasma is not used, such as low pressure chemical vapor deposition (LPCVD) or atmospheric pressure chemical vapor deposition (APCVD). As an alternative, there may be selected plasma CVD using micro-waves or electron cyclotron resonance effect.

Table 2 shows an example of gas species necessary for forming a thin film other than a silicon dioxide film by means of the plasma CVD apparatus illustrated in FIG. 11.

When a $Si_3N_4$ film is to be formed, there may be used $N_2$ gas or ammonia gas as a process gas, and Ar or $SiH_4$ (silane) gas as a carrier gas. When a thin silicon film is to be formed, there may be used hydrogen and silane gases. As an alternative, when a thin silicon film is to be formed, there may be used $H_2$ and $SiF_4$ gases as a process gas, and an argon gas as a carrier gas. It is also possible to treat a thin silicon film and a silicon dioxide film with hydrogen plasma.

The above-mentioned gases have such a purity as listed in Table 3.

TABLE 2

| | Formation of $SiO_2$ | Formation of $Si_3N_4$ | Formation of Si | Formation of Si | Hydrogenation |
|---|---|---|---|---|---|
| Gas 21 | $O_2$ | $N_2$ | | | |
| Gas 22 | He | Ar | | Ar | |
| Gas 23 | | | $H_2$ | $H_2$ | $H_2$ |
| Gas 24 | $SiH_4$ | $SiH_4$ | $SiH_4$ | | |

TABLE 2-continued

| | Formation of $SiO_2$ | Formation of $Si_3N_4$ | Formation of Si | Formation of Si | Hydrogenation |
|---|---|---|---|---|---|
| Gas 25 | He | Ar | | Ar | |
| Gas 26 | | | | $SiF_4$ | |

TABLE 3

| Gas Species | Necessarily | Preferably |
|---|---|---|
| $O_2$ | >99.999% | >99.9999% |
| He | >99.9999% | |
| Ar | >99.9999% | >99.99995% |
| $SiH_4$ | >99.999% | |
| $H_2$ | >99.9999% | >99.99997% |
| $N_2$ | >99.999% | >99.9999% |

FIGS. 12A to 12I illustrates respective steps of a method of fabricating a thin-film transistor by means of an apparatus for fabricating a thin semiconductor film.

Figure 12A:
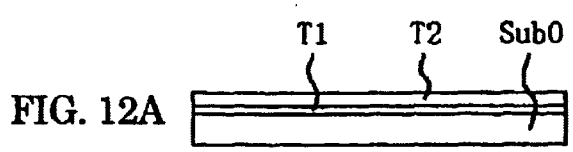
FIGS. 12A to 12I are cross-sectional views of a thin-film transistor, showing respective steps of a method of fabricating the same.

First, a glass substrate Sub0 is washed to remove organic substances, metals and particles therefrom. Then, a substrate cover film T1 and a thin silicon film T2 are formed on the glass substrate Sub0, as illustrated in FIG. 12A.

The substrate cover film T1 is comprised of a silicon dioxide film having a thickness of 1 μm and formed by LPCVD at 450 degrees centigrade using silane and oxygen gases as a process gas. It is possible to wholly cover a surface of the glass substrate Sub0 with the substrate cover film T1 by LPCVD. In place of LPCVD, there may be selected plasma CVD in which TEOS (tetraethoxy silane) and oxygen gases are used as a process gas, or plasma CVD in which silane and oxygen gases are used as a process gas.

The substrate cover film T1 is composed of a material which can prevent diffusion of impurities contained in the glass substrate such as a glass substrate having a reduced concentration of alkaline metal, or a quartz substrate having a polished surface, and hazardous to a semiconductor device.

The thin silicon film T2 has a thickness of 75 nm and is formed at 500 degrees centigrade by LPCVD in which disilane gas is used as a process gas. As an alternative, the thin silicon film T2 may be formed at 550 to 600 degrees centigrade by LPCVD in which monosilane is used as a process gas, or at 500 degrees centigrade or lower by LPCVD in which high grade silane such as trisilane is used as a process gas.

If the silicon film T2 is formed at 400 degrees centigrade or higher, a concentration of hydrogen atoms contained in the silicon film T2 is equal to or smaller than 1 atomic %, and hence, it would be possible to prevent the silicon film from being roughened because of evaporation of hydrogen while a laser beam is radiated to the substrate.

As an alternative, it is possible to form a thin silicon film having a low concentration of hydrogen atoms even by plasma CVD as illustrated in FIG. 11 or ordinary plasma CVD, by adjusting a temperature of the substrate, a ratio of hydrogen flow rate to silane flow rate, and a ratio of hydrogen flow rate to $SiF_4$ flow rate.

Then, the substrate Sub0 is washed to remove organic substances, metals, particles and oxides therefrom. Thereafter, the substrate Sub0 is introduced into the apparatus for forming a thin film, in accordance with the present invention.

Figure 12B:

Excimer laser XeCl having a wavelength of 308 nm is radiated to the thin silicon film T2 as a laser beam L0 to thereby reform the thin silicon film T2 to a thin crystal silicon film T2a, as illustrated in FIG. 12B. Crystallization by laser is carried out in nitrogen or inert gas atmosphere having a purity of 99.9999% or greater and at a vacuum degree of 700 Torr or greater.

After completion of laser radiation, an oxygen gas having a purity of 99.999% or greater is introduced into the apparatus. The above-mentioned nitrogen gas is used for preventing impurities from entering the thin silicon film T2a, prevent impurities such as hydrocarbon from reacting with a ultra-violet ray around a laser introduction window, and prevent impurities such as hydrocarbon from sticking to a laser introduction window in burning.

The reason why crystallization is carried out at 700 Torr or greater is that it is possible to prevent silicon evaporated by laser radiation from sticking to the laser introduction window.

Figure 12C:
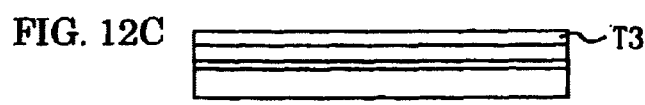

After exhausting the gases, the substrate Sub0 is transferred to the plasma CVD chamber through the substrate-transfer chamber. Then, a first gate insulating film T3 is formed at a substrate temperature of 350 degrees centigrade, using silane, helium and oxygen gases as process gases, as illustrated in FIG. 12C. The first gate insulating film T3 is comprised of a silicon dioxide film and has a thickness of 10 nm. Thereafter, the substrate is subject to hydrogen plasma treatment and annealing, if necessary.

The above-mentioned steps are carried out in the apparatus of forming a thin film, in accordance with the present invention.

Figure 12D:

Then, the thin silicon film T2a and the silicon dioxide film T3 are patterned into an island by photolithography and etching, as illustrated in FIG. 12D. In the step of patterning the films T2a and T3, it is preferable to select etching conditions in which an etching rate of the silicon dioxide film T3 is higher than an etching rate of the thin silicon film T2a.

As illustrated in FIG. 12D, the thin silicon film T2a and the silicon dioxide film T3 are patterned to have a stepped sidewall, which ensures prevention of gate leakage and hence high reliability. As an alternative, the thin silicon film T2a and the silicon dioxide film T3 may be patterned to have a tapered sidewall.

Figure 12E:
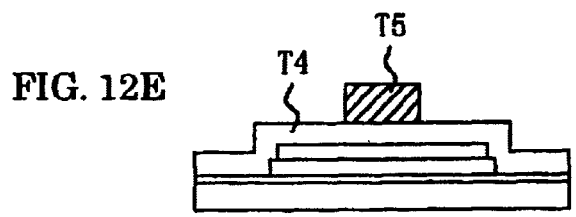

Then, the substrate Sub0 is washed to remove organic substances, metals, particles and oxides therefrom. Then, a second gate insulating film T4 is formed covering the island therewith, as illustrated in FIG. 12E. The second gate insulating film T4 is formed at 450 degrees centigrade by LPCVD in which silane and oxygen gases are used as process gases. The second gate insulating film is comprised of a silicon dioxide film and has a thickness of 30 nm.

As an alternative, the second gate insulating film T4 may be formed by plasma CVD in which TEOS and oxygen gases are used as process gases, APCVD in which TEOS and ozone are used as process gases, or plasma CVD as illustrated in FIG. 11.

Then, a N$^+$ silicon film having a thickness of 80 nm and a tungsten silicide film having a thickness of 110 nm are formed as a gate electrode. The N$^+$ silicon film is comprised preferably of a crystal phosphorus-doped silicon film formed by plasma CVD or LPCVD.

Thereafter, the N$^+$ silicon film and the tungsten silicide film are patterned by photolithography and etching into a gate electrode T5, as illustrated in FIG. 12E.

Figure 12F:
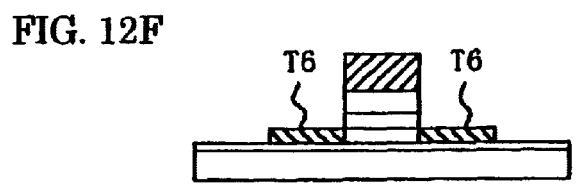
Figure 12H:
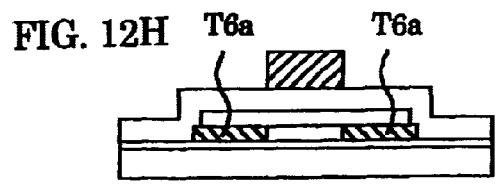

Then, as illustrated in FIGS. 12F and 12H, impurities are implanted into regions T6 and T6a with the gate electrode T5 being used as a mask. When a CMOS type integrated circuit is to be fabricated, photolithography is also carried out to thereby form both n-channel TFT including a N$^+$ region and a p-channel TFT including a P$^+$ region. There may be selected ion doping where mass separation of impurity ions to be implanted is not carried out, ion implantation, plasma doping or laser doping. Impurities are implanted to the regions T6 and T6a without removal of the silicon dioxide film or after removal of the silicon dioxide film in dependence on a use of a resultant device and/or a method of implanting impurities.

Figure 12G:
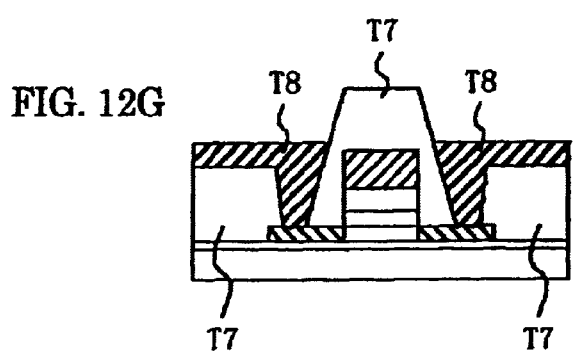
Figure 12I:
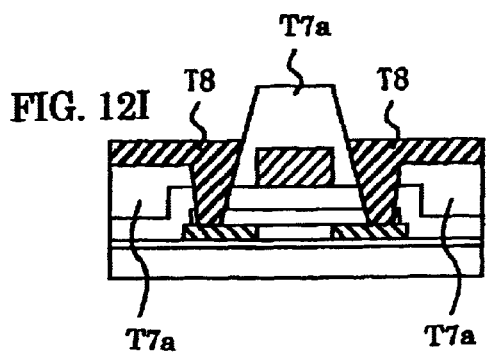

Then, as illustrated in FIGS. 12G and 12I, interlayer insulating films T7 and T7a are formed. After contact holes are formed throughout the interlayer insulating films T7 and T7a, a metal film is deposited over the products. Then, the metal film is patterned into a metal wiring layer T8 by photolithography and etching, as illustrated in FIGS. 12G and 12I.

The interlayer insulating films T7 and T7a are preferably TEOS oxide films, silica coating films, or organic coating films, because they can be readily planarized. The contact holes are formed by photolithography and etching. The metal wiring layer is composed preferably of aluminum or copper both having a low resistance, or an alloy predominantly containing aluminum or copper. As an alternative, the metal wiring layer may be composed of refractory metal such as tungsten or molybdenum.

Thus, there is fabricated a thin-film transistor having high performances and reliability.

FIGS. 13A to 13I illustrate respective steps of a method of fabricating a thin-film transistor. In this method, a substrate is designed to have an alignment mark, and a laser beam is radiated to the substrate in accordance with the alignment mark.

First, a glass substrate Sub0 is washed to remove organic substances, metals and particles therefrom. Then, a substrate cover film T1 and a tungsten silicide film are formed on the glass substrate Sub0. Then, the tungsten silicide film is patterned into an alignment mark T9 by photolithography and etching. Then, a mark protection film T10 is formed over the substrate cover film T1 and the alignment mark T9 to protect the alignment mark T9. Then, a thin silicon film T2 is formed on the mark protection film T10, as illustrated in FIG. 13A.

When a laser beam is radiated to the glass substrate Sub0, only desired regions of the substrate are exposed to a laser beam by using the alignment mark T9 as a registration mark, as illustrated in FIG. 13B.

Thereafter, alignment can be carried out in later steps based on the alignment mark T9 and an alignment mark (not illustrated) newly formed by patterning the thin crystal silicon film T2a.

Then, the steps having been explained with reference to FIGS. 12C to 12I are carried out as illustrated in FIGS. 13C to 13I.

Thus, there is fabricated a thin-film transistor having high performances and reliability.

FIGS. 14A to 14I illustrate respective steps of a method of fabricating a thin-film transistor. In this method, an alignment mark is formed at the same time when a laser beam is radiated to a substrate.

Figure 14A:
FIGS. 14A to 14I are cross-sectional views of a thin-film transistor, showing respective steps of still another method of fabricating the same.

First, a glass substrate Sub0 is washed to remove organic substances, metals and particles therefrom. Then, a substrate cover film T1 and a thin silicon film T2 are formed on the glass substrate Sub0, as illustrated in FIG. 14A.

Then, the substrate Sub0 is washed to remove organic substances, metals, particles and oxides therefrom. Thereafter, the substrate Sub0 is introduced into the apparatus for forming a thin film, in accordance with the present invention.

Figure 14B:
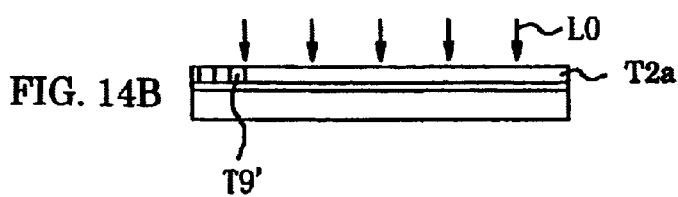

Excimer laser XeCl having a wavelength of 308 nm is radiated to the thin silicon film T2 as a laser beam L0 to thereby reform the thin silicon film T2 to a thin crystal silicon film T2a, as illustrated in FIG. 14B. At the same time when the laser beam is radiated to the thin silicon film T2, a crystallized alignment mark T9 is formed in the thin crystal silicon film T2a, making use of a difference in quality between an exposed region and a non-exposed region.

After completion of laser radiation, an oxygen gas having a purity of 99.999% or greater is introduced into the apparatus. The above-mentioned nitrogen gas is used for preventing impurities from entering the thin silicon film T2a, prevent impurities such as hydrocarbon from reacting with a ultra-violet ray around a laser introduction window, and prevent impurities such as hydrocarbon from sticking to a laser introduction window in burning.

The reason why crystallization is carried out at 700 Torr or greater is that it is possible to prevent silicon evaporated by laser radiation from sticking to the laser introduction window.

Figure 14C:
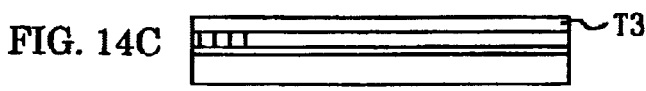

After exhausting the gases, the substrate Sub0 is transferred to the plasma CVD chamber through the substrate-transfer chamber. Then, a first gate insulating film T3 is formed at a substrate temperature of 350 degrees centigrade, using silane, helium and oxygen gases as process gases, as illustrated in FIG. 14C. The first gate insulating film T3 is comprised of a silicon dioxide film and has a thickness of 10 nm. Thereafter, the substrate is subject to hydrogen plasma treatment and annealing, if necessary.

Figure 14D:
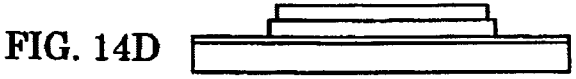
Figure 14E:
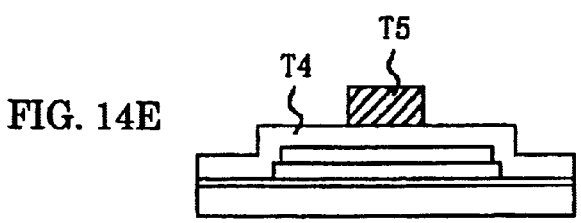
Figure 14F:
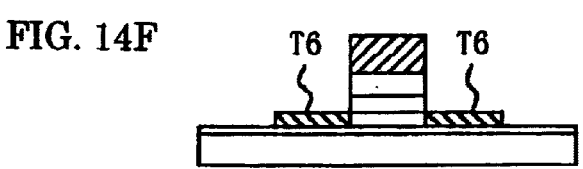
Figure 14H:
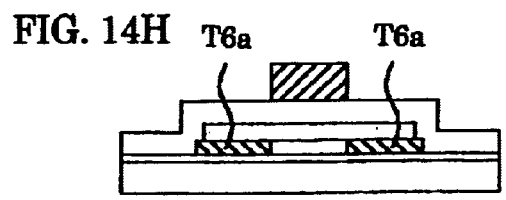
Figure 14G:
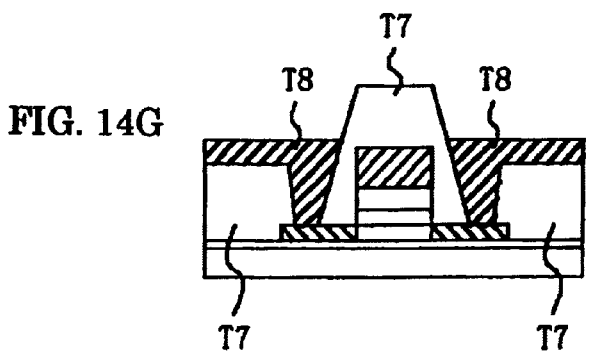
Figure 14I:
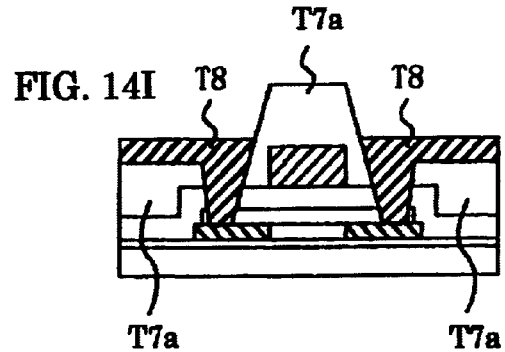

Then, the thin silicon film 2a and the first gate insulating film T3 are patterned into an island by photolithography and etching, as illustrated in FIG. 14D. In this photolithography, the crystallized alignment mark T9 acts as a registration mark.

Then, the steps having been explained with reference to FIGS. 12E to 12I are carried out as illustrated in FIGS. 14E to 14I.

Thus, there is fabricated a thin-film transistor having high performances and reliability.

While the present invention has been described in connection with certain preferred embodiments, the advantages obtained by the aforementioned present invention is described hereinbelow.

As mentioned above, in accordance with the present invention, oxygen gas having a high purity is introduced into a vacuum chamber just after a laser beam has been radiated to a silicon film for crystallization. As a result, a natural oxidation film having a low concentration of impurity is formed on a surface of the silicon film. Since a surface of the silicon film having been crystallized by laser radiation is quite active, contaminants readily adhere to the surface of the silicon film. However, the present invention makes it possible to prevent contaminants existing in the chamber from adhering to a surface of the silicon film. Accordingly, since a frequency of cleaning and maintenance of the chamber can be reduced, it is possible to reduce an efficiency of operation of the apparatus, ensuring enhancement of a total fabrication efficiency of a semiconductor device.

In addition, since it is possible to reduce an amount of carbon existing in a silicon dioxide film and an interface of a silicon dioxide film, it is possible to reduce current leakage in a thin-film transistor.

At the same time when oxygen gas is decomposed by a laser beam, silicon having adhered to a laser introduction window and having not been oxidized by oxygen is heated. Hence, the thus heated silicon reacts with the decomposed active oxygen to thereby form silicon dioxide, ensuring reduction in a transmission rate of a laser beam.

The present invention prevents contaminants such as metal and carbon from adhering to a surface of a silicon film formed on a substrate, and further prevents reduction in a transmission rate of a laser beam into a laser introduction window. As a result, it is possible to form a qualified interface or gate insulating film over the silicon film formed on a large-area substrate, ensuring that there is provided a field effect transistor including an interface between semiconductor and an insulating film which interface has a small interface level density, that is, having superior performance.

In addition, the present invention makes it possible to present a semiconductor device having the same characteristics of a conventional semiconductor device and being able to be formed at room temperature to 600 degrees centigrade, even if a cheap glass substrate is used.

Furthermore, the present invention makes it possible to carry out maintenance of the apparatus with an efficiency of operation of the apparatus being kept high.

The present invention provides the secondary advantages as follows.

First, the present invention provides an apparatus of forming a thin semiconductor film which apparatus can omit a step of washing a substrate with chemical and which apparatus has high stability.

Secondly, the present invention provides an apparatus which can carry out various steps, ensuring reduction in a total area of a factory.

Thirdly, the present invention provides a method and an apparatus both of which are capable of keeping a washed surface of a silicon film clean without chemicals.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 11-201974 filed on Jul. 15, 1999 including specification, claims, drawings and summary is incorporated herein by reference in its entirety.

What is claimed is:

1. method of fabricating a thin-film semiconductor device, comprising the steps of:
   (a) melting and recrystallizing at least a surface of a thin semiconductor film formed on a substrate, in a pressure lower than an atmospheric pressure or in inert gas atmosphere;
   (b) keeping said substrate in atmosphere including oxygen gas; and
   (c) forming an insulating film on said thin semiconductor film with said substrate being kept in a pressure lower than an atmospheric pressure or inert gas atmosphere.

2. The method as set forth in claim 1, wherein said atmosphere predominantly includes oxygen gas.

3. The method as set forth in claim 1, wherein said atmosphere includes oxygen gas having purity of 99.999% or greater.

4. The method as set forth in claim 3, wherein said atmosphere further includes hydrogen gas having purity of 99.999% or greater.

5. The method as set forth in claim 3, wherein said atmosphere further includes nitrogen gas having purity of 99.999% or greater.

6. The method as set forth in claim 3, wherein said atmosphere further includes inert gas having purity of 99.999% or greater.

7. The method as set forth in claim 3, wherein a process gas used for forming said insulating film has purity of 99.999% or greater.

8. The method as set forth in claim 1, wherein a process gas used in said method includes hydrocarbon (CnHm) species having a total concentration of 1 ppm or smaller.

9. The method as set forth in claim 1, wherein recrystallization in said step (a) is carried out through laser radiation.

10. method of fabricating a thin-film semiconductor device, comprising the steps, in sequence, of:
   (a) introducing a substrate into a vacuous chamber;
   (b) introducing non-reactive gas into said chamber;
   (c) radiating laser beam to said substrate in said chamber;
   (d) introducing oxygen gas into said chamber;
   (e) exhausting said non-reactive gas and said oxygen gas until a pressure in said chamber is reduced down to a predetermined pressure; and
   (f) taking said substrate out of said chamber.

11. The method as set forth in claim 10, wherein said non-reactive gas comprises at least one of a nitrogen gas, an inert gas, and hydrogen gas.

12. The method as set forth in claim 10, further comprising, before exhausting said non-reactive gas and said oxygen gas, directing said laser beam to a window of said vacuum chamber, such that, said laser beam does not irradiate said portion of said substrate, which was previously irradiated.

13. A method as set forth in claim 10, further comprising heating said substrate.

14. A method of fabricating a thin-film semiconductor device, comprising:
   introducing a substrate into a vacuum chamber;
   introducing a non-reactive gas into said vacuum chamber, such that, a first pressure of 700 Torr or greater is attained;
   irradiating a portion of said substrate in said vacuum chamber with a laser beam;
   stopping of said introducing of said non-reactive gas into said vacuum chamber;
   after irradiating said portion of said substrate and said stopping of said introducing of said non-reactive gas, introducing oxygen gas into said chamber, such that, said vacuum chamber maintains said first pressure; and
   transferring said substrate from said vacuum chamber into a processing chamber having a second pressure equal to said first pressure.

15. The method as set forth in claim 14, further comprising:
   after said substrate has been transferred into said processing chamber, directing said laser beam to a window of said vacuum chamber; and
   subsequently exhausting said non-reactive gas and said oxygen gas until said processing chamber attains a predetermined pressure less than said first pressure.

16. The method as set forth in claim 14, wherein said non-reactive gas comprises at least one of a nitrogen gas, an inert gas, and a hydrogen gas.

17. The method as set forth in claim 14, wherein after attaining said first pressure, said non-reactive gas is maintained at said first pressure in said vacuum chamber.

18. The method as set forth in claim 14, further comprising heating said substrate.

19. The method as set forth in claim 1, further comprising forming said thin silicon film by using at least one of a gaseous silane, being one of monosilane, disilane, or trisialane, argon gas, hydrogen gas, and silicon tetrafluoride, on a substrate cover film.

20. The method as set forth in claim 1, further comprising:
   removing a portion of said first gate insulating film and said thin crystal silicon film to expose said substrate cover film; and
   forming a second gate insulating film on said first gate insulating film, said thin crystal silicon film, and said substrate cover film.

21. The method as set forth in claim 1, further comprising:
   forming a gate electrode above said second gate insulating film; and
   doping a portion of said thin crystal silicon film with ions by using said gate electrode as a mask.

22. The method as set forth in claim 1, further comprising:
   forming an interlayer insulating film above said portion of said thin crystal silicon film that is doped, said first gate insulating film, said second gate insulating film, and said gate electrode; and
   forming a contact hole through said interlayer insulating film to said portion of said thin crystal silicon film that is doped.

23. The method as set forth in claim 1, wherein irradiating said thin silicon film with a laser beam is limited to a portion of said thin silicon film, determined by an alignment mark formed on a layer disposed beneath said thin silicon film, that acts as a registration mark.

24. The method as set forth in claim 1, wherein irradiating said thin silicon film with a laser beam is limited to a portion of said thin silicon film, determined by a crystallized alignment mark formed in said thin silicon film, that acts as a registration mark.

25. The method as set forth in claim 1, wherein said inert gas comprises at least one of nitrogen gas, helium gas, and argon gas.

* * * * *